(12) United States Patent
Go et al.

(10) Patent No.: US 11,011,733 B2
(45) Date of Patent: May 18, 2021

(54) DISPLAY PANEL AND METHOD OF FABRICATING THE SAME

(71) Applicant: Samsung Display Co., Ltd., Yongin-Si (KR)

(72) Inventors: Jaekyung Go, Yongin-si (KR);
Yongseung Park, Gyeonggi-do (KR);
Chanyoung Park, Yongin-si (KR);
Danbi Choi, Seongnam-si (KR);
Soukjune Hwang, Seoul (KR);
Hyunmin Hwang, Cheonan-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/130,963

(22) Filed: Sep. 13, 2018

(65) Prior Publication Data

US 2019/0181387 A1   Jun. 13, 2019

(30) Foreign Application Priority Data

Dec. 8, 2017  (KR) .................. 10-2017-0168679

(51) Int. Cl.
  *H01L 51/56*  (2006.01)
  *H01L 51/52*  (2006.01)
  (Continued)

(52) U.S. Cl.
  CPC .......... *H01L 51/56* (2013.01); *H01L 27/3246* (2013.01); *H01L 51/0023* (2013.01); *H01L 51/5203* (2013.01); *H01L 51/5237* (2013.01); *H01L 51/5246* (2013.01); *G09G 3/3208* (2013.01); *G09G 2310/0278* (2013.01); *H01L 27/323* (2013.01); *H01L 51/5056* (2013.01);
  (Continued)

(58) Field of Classification Search
  CPC . H01L 51/56; H01L 51/5246; H01L 51/5237; H01L 51/0023; H01L 51/5203; H01L 27/3246; H01L 2251/566; H01L 51/5072; H01L 27/323; H01L 51/5056; H01L 27/3244; G09G 3/3208; G09G 2310/0278
  See application file for complete search history.

(56) References Cited

U.S. PATENT DOCUMENTS 9,123,593 B2    9/2015  Kang et al.
2009/0015136 A1*  1/2009  Lee ..................... H05B 33/04
                                                  313/503
(Continued)

FOREIGN PATENT DOCUMENTS

KR    10-2012-0119082 A   10/2012
KR    10-2014-0136237 A   11/2014
(Continued)

*Primary Examiner* — Abhishek Sarma
(74) *Attorney, Agent, or Firm* — Innovation Counsel LLP

(57) ABSTRACT

A display device may include first and second regions connected to each other. When viewed in a plan view, the first and second regions may have a curved edge and a rectilinear edge, respectively. When viewed in a sectional view, a side surface of the first region may include a center region having a rectilinear shape and a side surface of the second region may include a center region having a curved shape. In some embodiments, the side surface of the first region has a first roughness, and a side surface of the second region has a second roughness that is smoother than the first roughness.

5 Claims, 26 Drawing Sheets

(51) Int. Cl.
  *H01L 51/00* (2006.01)
  *H01L 27/32* (2006.01)
  *H01L 51/50* (2006.01)
  *G09G 3/3208* (2016.01)

(52) U.S. Cl.
  CPC .... *H01L 51/5072* (2013.01); *H01L 2251/566* (2013.01)

(56) References Cited

U.S. PATENT DOCUMENTS

2016/0037607 A1* 2/2016 Kim .................. H05B 33/20 313/512
2017/0153472 A1   6/2017 Go et al.

FOREIGN PATENT DOCUMENTS

| KR | 10-2015-0072743 A | 6/2015 |
| KR | 10-2017-0061769 A | 6/2017 |

\* cited by examiner

DISPLAY PANEL AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2017-0168679, filed on Dec. 8, 2017, in the Korean Intellectual Property Office, the entire contents of which are hereby incorporated by reference.

BACKGROUND OF THE INVENTION

The present disclosure relates to a display panel and a method of fabricating the same, and in particular, to a display panel with a curved edge and a method of fabricating a display panel with an increased production yield.

A display panel is formed from a working panel. The working panel includes two opposite working substrates. The working panel includes a plurality of cell regions. Each of the cell regions is cut and polished to form the display panel.

Production efficiency and cost of the display panel are determined by the process of cutting and polishing the cell regions.

SUMMARY

Some embodiments of the inventive concept provide a display panel whose edge is partially formed to have a curved shape, when viewed in a plan view.

Some embodiments of the inventive concept provide a method of fabricating a display panel with reduced fabricating time and cost.

According to some embodiments of the inventive concept, a display panel may include a first region, which includes a curved edge when viewed in a plan view, and a second region, which includes a rectilinear edge when viewed in a plan view and is adjacent to the first region. When viewed in a sectional view, a side surface of the first region may include a center region having a rectilinear line, and when viewed in a sectional view, a side surface of the second region may include a center region having a curved line.

In some embodiments, the display panel may further include a third region, which includes a rectilinear edge when viewed in a plan view and is adjacent to the first region. When viewed in a sectional view, a side surface of the third region may include a center region corresponding to the center region of the side surface of the first region.

In some embodiments, the first region and the third region may define a concave region of the display panel, when viewed in a plan view.

In some embodiments, when viewed in a sectional view, the side surface of the first region may further include an upper region, which is provided on the center region, and a lower region, which is provided below the center region. When viewed in a sectional view, the upper region may include an inclined line.

In some embodiments, when viewed in a sectional view, the side surface of the second region may further include an upper region, which is provided on the center region, and a lower region, which is provided below the center region. When viewed in a sectional view, the upper region may include at least a rectilinear line.

In some embodiments, when viewed in a sectional view, the upper region of the side surface of the second region may further include at least an inclined line, and the rectilinear line of the upper region may be provided between the inclined line of the upper region and the curved line of the center region of the second region.

According to some embodiments of the inventive concept, a display panel may include a first region, which has a curved edge when viewed in a plan view, and a second region, which has a rectilinear edge when viewed in a plan view and is continuous from the first region. A side surface of the first region may have a first roughness, and a side surface of the second region may have a second roughness that is smoother than the first roughness.

In some embodiments, when viewed in a sectional view, the side surface of the first region may include a center region having a rectilinear line, and when viewed in a sectional view, the side surface of the second region may include a center region having a curved line.

According to some embodiments of the inventive concept, a display panel may include a display substrate including a first edge including a first lower region and a second lower region, the first lower region having a curved line and the second lower region having a rectilinear line, when viewed in a plan view, an encapsulation substrate, which faces the display substrate and to include a second edge including a first upper region and a second upper region, the first upper region having a curved line corresponding to that of the first lower region and the second upper region having a rectilinear line corresponding to the second lower region, and a sealing element coupling the display substrate to the encapsulation substrate. When viewed in a sectional view, a side surface of each of the first lower region and the first upper region may include an internal region having a rectilinear line, when viewed in a sectional view, a side surface of each of the second lower region and the second upper region may include an internal region having a curved line.

In some embodiments, when viewed in a sectional view, the side surface of the first lower region and the side surface of the first upper region may be substantially aligned to a side surface of the sealing element.

In some embodiments, the internal region of each of the first lower region and the first upper region may have a first roughness, and the internal region of each of the second lower region and the second upper region may have a second roughness, the second roughness being smoother than the first roughness.

In some embodiments, the encapsulation substrate may include a glass substrate with a top surface and a bottom surface, and the sealing element may be directly coupled to the bottom surface of the encapsulation substrate.

In some embodiments, the encapsulation substrate may further include a touch sensing unit including sensor electrodes provided on the top surface.

In some embodiments, the display substrate may include a glass substrate, a circuit device layer on the glass substrate, the circuit device layer including a conductive pattern and a transistor, and a display device layer on the circuit device layer, the display device layer including an organic light emitting diode.

In some embodiments, the sealing element may be directly coupled to the conductive pattern of the circuit device layer, and the conductive pattern and an electrode of the transistor may be disposed on the same layer.

In some embodiments, the display substrate may further include a pad region that is exposed by the encapsulation substrate, when viewed in a plan view.

According to some embodiments of the inventive concept, a method of fabricating a display panel may include separating a preliminary-display panel from a working panel, the preliminary-display panel including a preliminary-display substrate, a preliminary-encapsulation substrate facing the preliminary-display substrate, and a preliminary-sealing element coupling the preliminary-display substrate to the preliminary-encapsulation substrate and including a rectilinear region and a curved region when viewed in a plan view, forming a preliminary-curved region, which corresponds to the curved region of the preliminary-sealing element, in each of the preliminary-display substrate and the preliminary-encapsulation substrate, and polishing the preliminary-curved region.

In some embodiments, the working panel may include a working display substrate including cell regions, a working encapsulation substrate facing the working display substrate, and working-sealing elements coupling the working display substrate to the working encapsulation substrate. The working-sealing elements may be disposed corresponding to the cell regions. The working encapsulation substrate may include a base substrate and light-blocking patterns, which are disposed on an outer surface of the base substrate and are partially overlapped with the working-sealing elements.

In some embodiments, the separating of the preliminary-display panel may include optically curing the working-sealing elements using the light-blocking patterns as a mask, and cutting the working display substrate and the working encapsulation substrate along a cutting line, which is overlapped with an exposed region of each of the working-sealing elements, to form a plurality of pieces corresponding to the cell regions, respectively.

In some embodiments, the preliminary-sealing element may further include a concave region, when viewed in a plan view. The method may further include forming a preliminary-concave region, which corresponds to the concave region of the preliminary-sealing element, in each of the preliminary-display substrate and the preliminary-encapsulation substrate, and polishing the preliminary-concave region.

In some embodiments, the polishing of the preliminary-curved region may be performed to substantially align a side surface of the preliminary curved region of the preliminary-display substrate and a side surface of the preliminary curved region of the preliminary-encapsulation substrate to a side surface of the preliminary-sealing element, when viewed in a sectional view.

In some embodiments, the method may further include partially cutting the preliminary-encapsulation substrate to expose a portion of the preliminary-display substrate, after the separating of the preliminary-display panel.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1A:
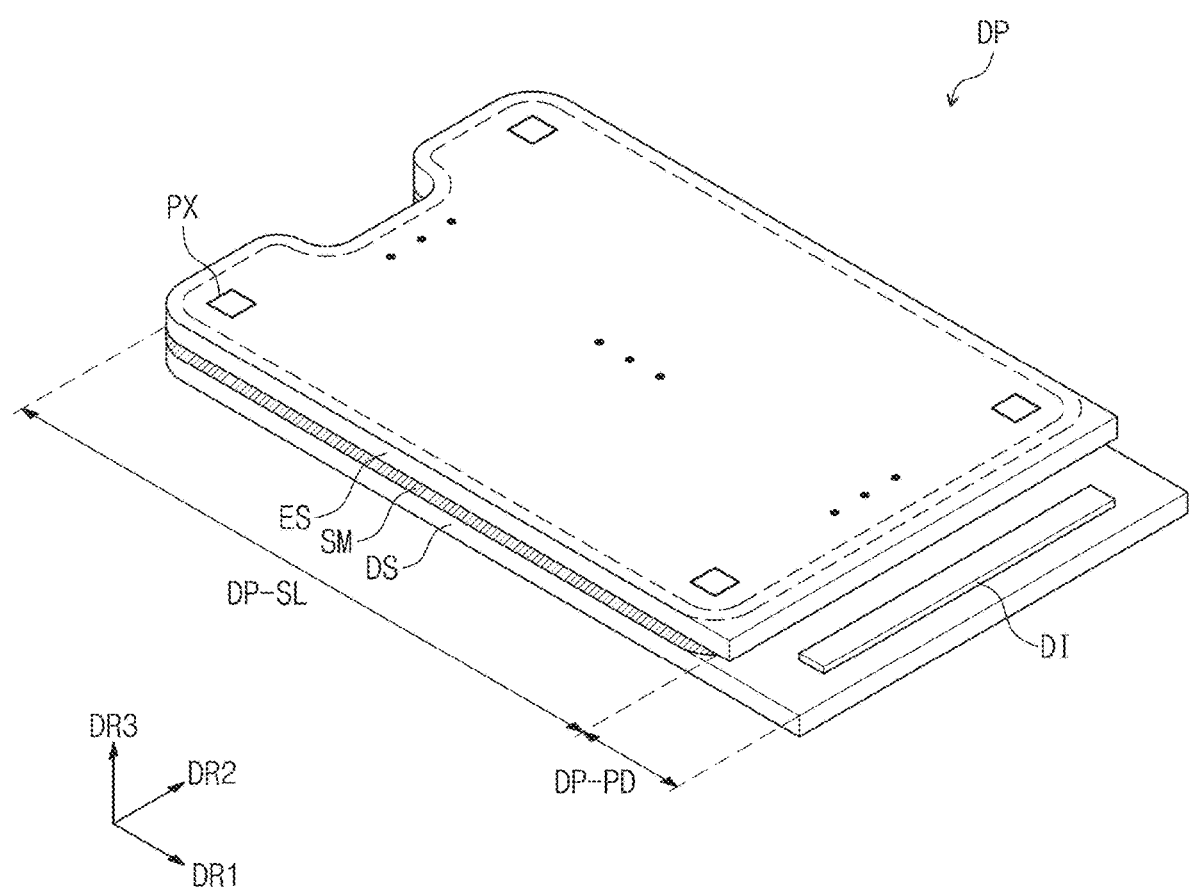
FIG. 1A is a perspective view illustrating a display panel according to some embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
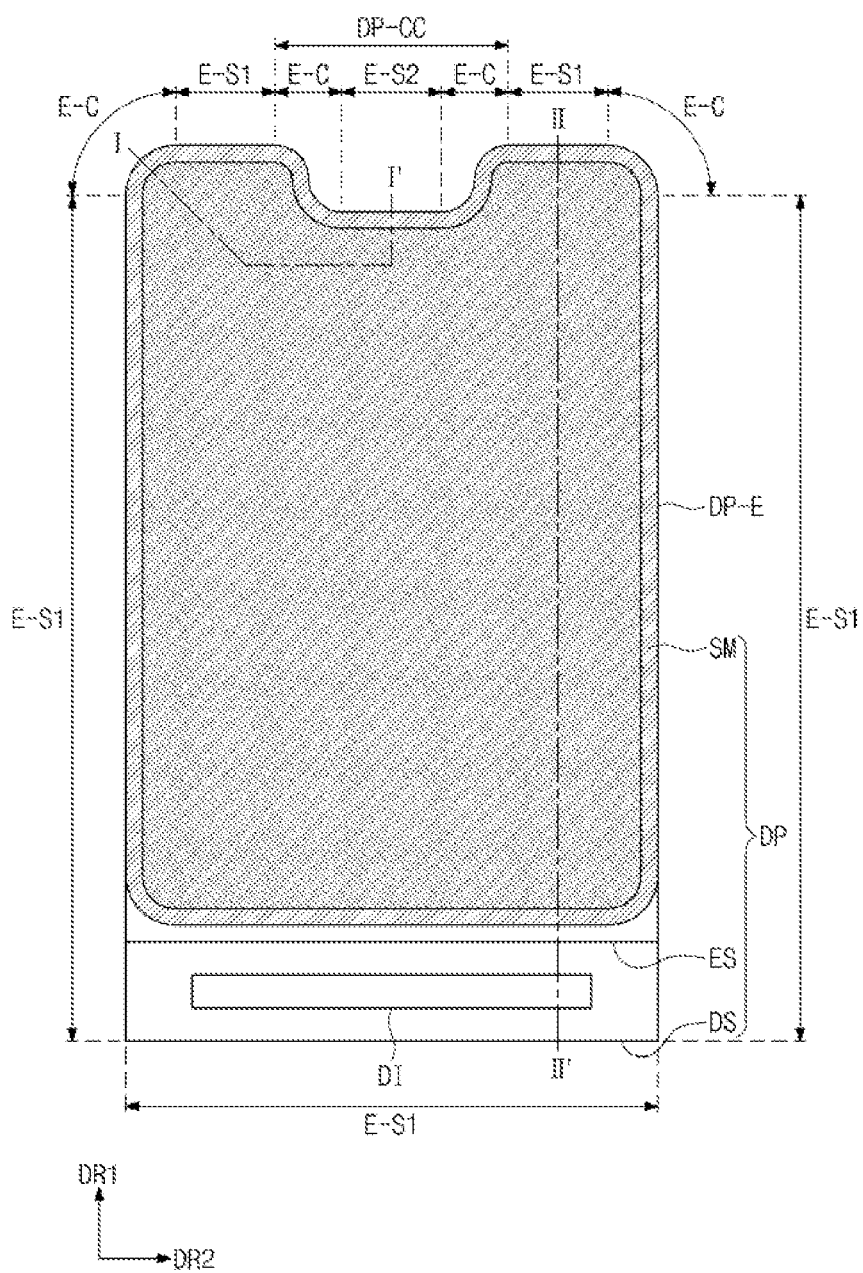
FIG. 1B is a plan view illustrating a display panel according to some embodiments of the inventive concept.
Figure 1C:
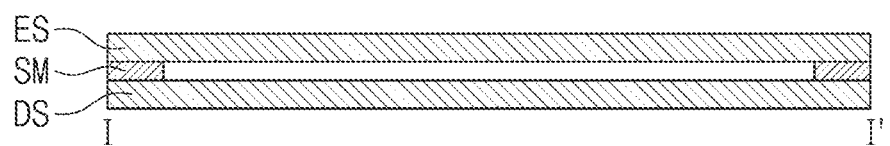
FIGS. 1C and 1D are sectional views, each illustrating a display panel according to some embodiments of the inventive concept.
Figure 1D:
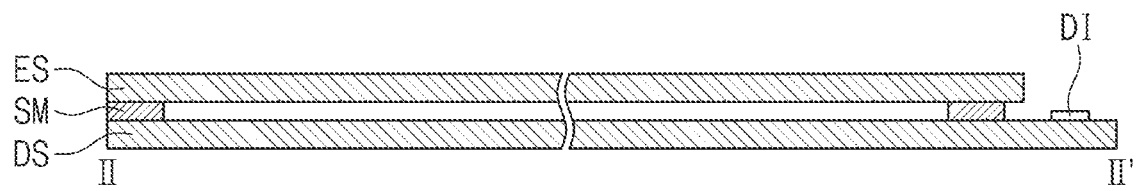

FIG. 1A is a perspective view illustrating a display panel DP according to some embodiments of the inventive concept. FIG. 1B is a plan view illustrating the display panel DP according to some embodiments of the inventive concept. FIGS. 1C and 1D are sectional views, each of which illustrates the display panel DP according to some embodiments of the inventive concept.

As shown in FIG. 1A, the display panel DP may include a display substrate DS, an encapsulation substrate ES, and a sealing element SM, which is used to attach the encapsulation substrate ES to the display substrate DS. The display substrate DS may include a plurality of pixels PX, which are configured to generate an image. The encapsulation substrate ES may be configured to hermetically seal the pixels PX and thereby to prevent the pixels PX from being damaged by external moisture and so forth.

The display panel DP may further include a driving device DI that is coupled to the display substrate DS. The driving device DI may be a chip that is integrated on the display substrate DS. However, the inventive concept is not limited thereto, and in certain embodiments, the driving device DI may not be provided on the display substrate DS.

Each of the display and encapsulation substrates DS and ES may include a glass substrate serving as a base substrate thereof. The display substrate DS may have an area larger than that of the encapsulation substrate ES. The driving device DI may be provided on a region of the display substrate DS exposed by the encapsulation substrate ES. However, the inventive concept is not limited thereto, and in certain embodiments, the display substrate DS may be provided to have substantially the same shape as that of the encapsulation substrate ES.

In some embodiments, the sealing element SM may be formed of or include frit. The frit is a ceramic adhesive material, which is melted and solidified through a laser exposure process. The frit may include 15-40 wt % $V_2O_5$, 10-30 wt % $TeO_2$, 1-15 wt % $P_2O_5$, 1-15 wt % BaO, 1-20 wt % ZnO, 5-30 wt % $ZrO_2$, and 5-20 wt % $WO_3$m which are used as a principal ingredient, and at least one of $Fe_2O_3$, CuO, MnO, $Al_2O_3$, $Na_2O$, or $Nb_2O_5$, which are used as an additive agent. If the frit is prepared to have the above composition, the frit may have a thermal expansion coefficient of $40\text{-}100 \times 10^{-7}/°$ C. and a glass transition temperature of 250-400° C.

The encapsulation substrate ES may provide a display surface, on which the image generated by the display panel DP is displayed. In FIG. 1A, dotted lines depict a region, in which the sealing element SM is provided. The display panel DP may have a front surface that is parallel to a first direction axis DR1 and a second direction axis DR2. A normal direction of the front surface of the display panel DP (i.e., a thickness direction of the display panel DP) may be referred to as a third direction axis DR3. In each of layers constituting the display panel DP, a top or front surface may be differentiated from a bottom or rear surface, based on the third direction axis DR3. Hereinafter, first to third directions may be directions indicated by the first to third direction axes DR1, DR2, and DR3, respectively, and will be identified with the same reference numbers.

The display panel DP may include a sealing region DP-SL and a pad region DP-PD, when viewed in a plan view. The sealing region DP-SL may include an internal region delimited by the dotted lines or by the sealing element SM. The pixels PX of the display panel DP may be provided within the internal region of the sealing region DP-SL. The pad region DP-PD may be the remaining region of the display panel DP, except for the sealing region DP-SL. The driving device DI may be provided on the pad region DP-PD.

A flat display panel is exemplarily illustrated in FIG. 1A, but the inventive concept is not limited thereto. For example, a portion of the display panel DP may be bent to allow the display panel DP to have a curved front surface. In certain embodiments, the display substrate DS may be bent in such a way that the pad region DP-PD, which is not veiled by the encapsulation substrate ES, is located to face the rear surface of the display panel DP. For example, the display substrate DS may be bent along the second direction axis DR2, which is used as a bending axis.

As shown in FIGS. 1A and 1B, the display panel DP may include curved regions E-C with curved edges and linear regions (or rectilinear regions) E-S1 and E-S2 with linear edges, when viewed in a plan view. In other words, the display panel DP may have an edge DP-E including curved portions and linear portions, when viewed in a plan view.

When viewed in a plan view, the edge DP-E of the display panel DP may have substantially the same shape as that of the edge of the display substrate DS. When viewed in a plan view, the edge of the display substrate DS may have substantially the same shape as that of the edge of the encapsulation substrate ES, except for a specific region. For example, when viewed in a plan view, most parts of the edge of the display substrate DS may be substantially aligned with the edge of the encapsulation substrate ES, and a lower edge of the encapsulation substrate ES adjacent to the pad region DP-PD may not be aligned to a lower edge of the display substrate DS, as shown in FIG. 1B.

As shown in FIGS. 1A and 1B, when viewed in a plan view, the edge of the display panel DP may include four curved regions E-C (hereinafter, first regions) and six rectilinear regions E-S1 and E-S2. The rectilinear regions E-S1 and E-S2 may be classified into two groups, as a result of its fabrication process. Sectional shapes of the two groups may differ from each other. This will be described in more detail below.

When viewed in a plan view, the curved regions E-C may be provided at two corner regions of an upper portion of the display panel DP. When viewed in a plan view, a concave region DP-CC may be defined at the upper portion of the display panel DP. The rectilinear regions E-S1 (hereinafter, second regions) may be respectively provided between the concave region DP-CC and the two corner regions. The concave region DP-CC may be a region of the display panel DP whose edge is recessed toward a center of the display panel DP, when viewed in a plan view. The concave region DP-CC may be defined by two curved regions E-C and one rectilinear region E-S2 (hereinafter, a third region) therebetween. However, the inventive concept is not limited to a specific shape of the concave region DP-CC.

Each of left, right, and lower edges of the display panel DP may have a linear shape, when viewed in a plan view. For example, each of the left, right, and lower edges of the display panel DP may be configured to have the rectilinear region E-S1.

When viewed in a sectional view, the sealing element SM may be aligned to the display and encapsulation substrates DS and ES in most regions. As shown in FIGS. 1B to 1D, the edge of the sealing element SM may be substantially aligned to the edges of the display and encapsulation substrates DS and ES, in each of the first region E-C, the second region E-S1, and the third region E-S2, when viewed in a sectional view. However, the edge of the sealing element SM adjacent to the pad region DP-PD may not be aligned to the edge of the encapsulation substrate ES and the edge of the display substrate DS.

When viewed in a plan view, the edge of the display substrate DS may be referred to as 'a first edge' and the edge of the encapsulation substrate ES may be referred to as 'a second edge'. The first edge may include a first lower region, a second lower region, and a third lower region, which correspond to the first region E-C, the second region E-S1, and the third region E-S2, respectively, of the display panel. The second edge may include a first upper region, a second upper region, and a third upper region, which correspond to the first region E-C, the second region E-S1, and the third region E-S2, respectively, of the display panel. Except for the pad region DP-PD, the first lower region, the second lower region, and the third lower region may correspond to the first upper region, the second upper region, and the third upper region, respectively.

Figure 2A:
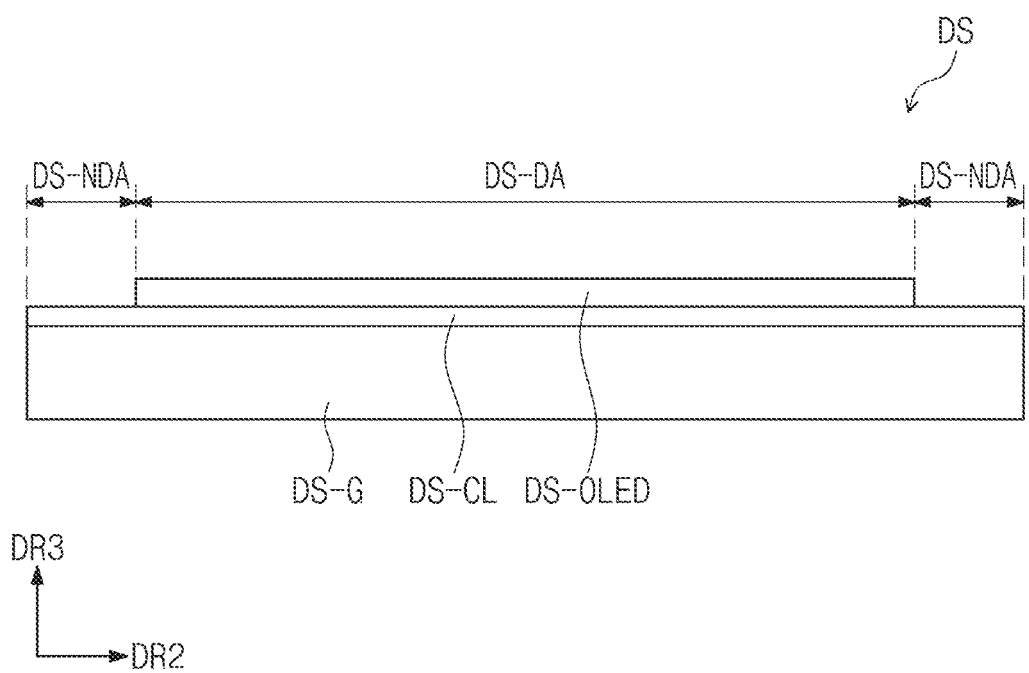
FIG. 2A is a sectional view of a display substrate according to some embodiments of the inventive concept.
Figure 2B:
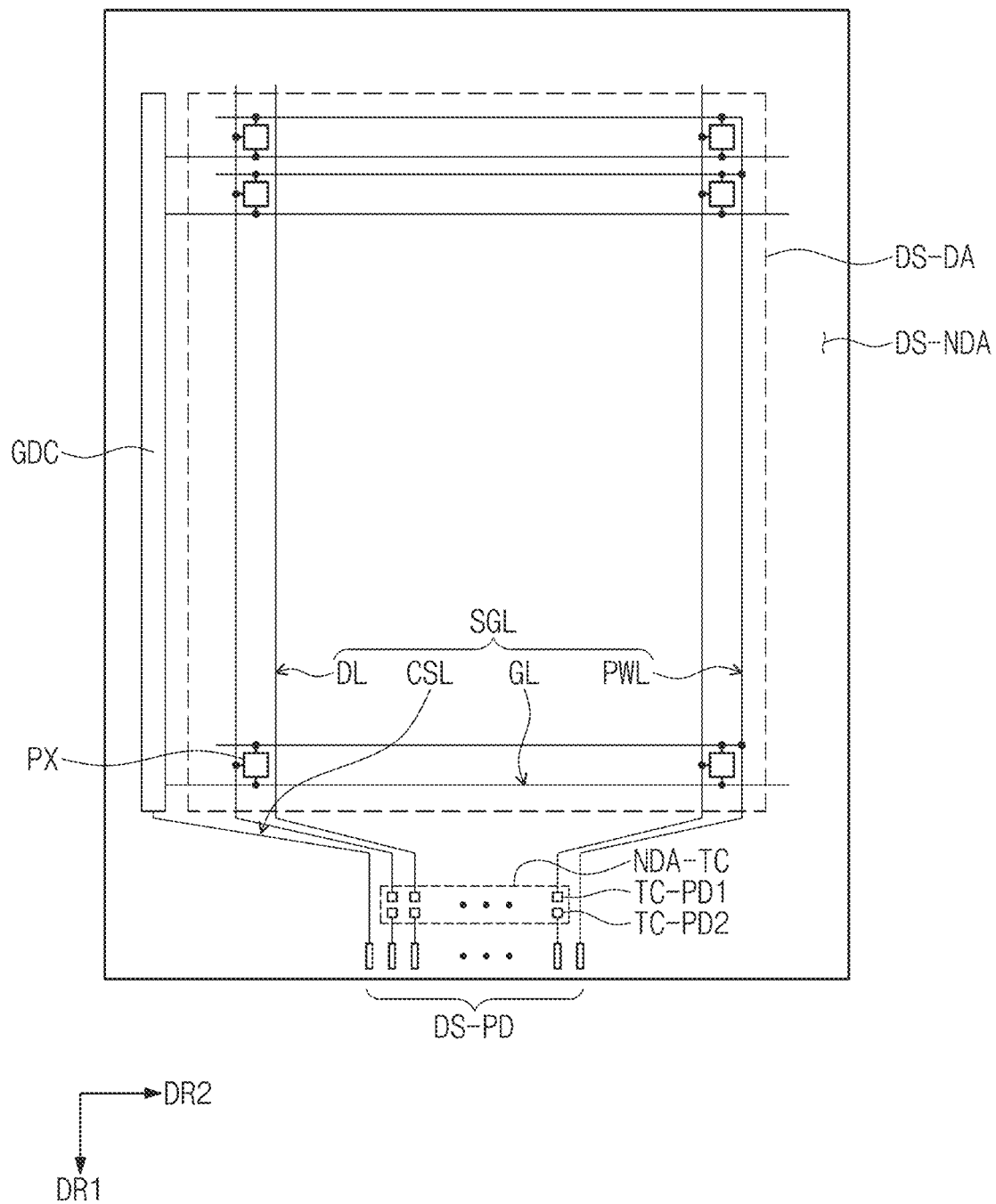
FIG. 2B is a plan view of a display substrate according to some embodiments of the inventive concept.
Figure 2C:
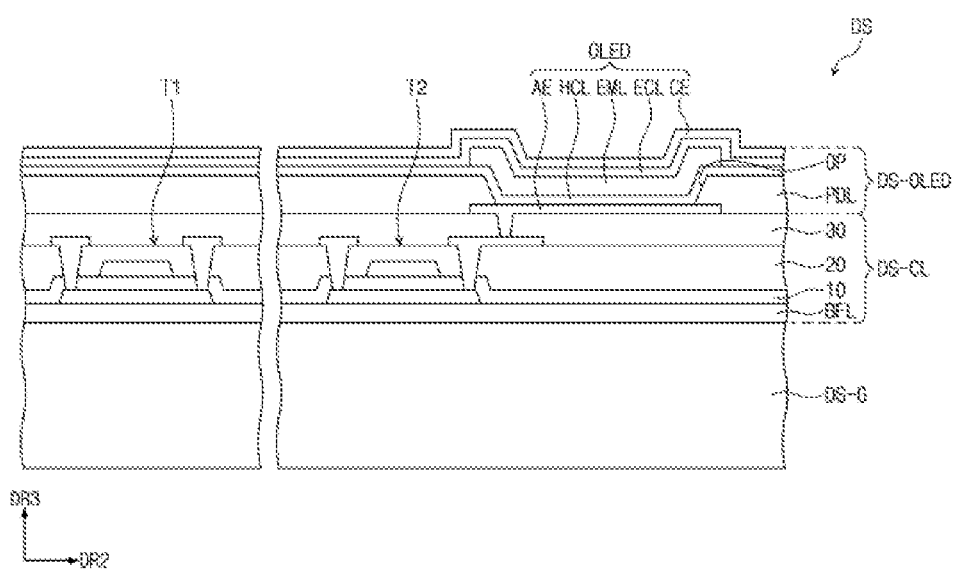
FIG. 2C is a sectional view illustrating a portion of a pixel according to some embodiments of the inventive concept.

FIG. 2A is a sectional view illustrating the display substrate DS according to some embodiments of the inventive concept. FIG. 2B is a plan view illustrating the display substrate DS according to some embodiments of the inventive concept. FIG. 2C is a sectional view illustrating a portion of the pixel PX according to some embodiments of the inventive concept.

As shown in FIG. 2A, the display substrate DS may include a base substrate DS-G and a circuit device layer DS-CL and a display device layer DS-OLED, which are provided on the base substrate DS-G. Although not shown, the display substrate DS may further include functional layers (e.g., a capping layer, an anti-reflection layer, and a refractive index control layer).

The base substrate DS-G may be a glass substrate. The circuit device layer DS-CL may include at least one insulating layer and at least one circuit device. The circuit device may include signal lines and a circuit for driving a pixel. The formation of the circuit device layer DS-CL may include forming insulating, semiconductor, and conductive layers using a coating or deposition process and then patterning them using a photolithography process.

The display device layer DS-OLED may include at least one light emitting device. For example, the display device layer DS-OLED may include organic light emitting diodes. The display device layer DS-OLED may further include an organic layer, which may be used as, for example, a pixel definition layer.

As shown in FIGS. 2A and 2B, the display substrate DS may include a display region DS-DA and a non-display region DS-NDA. The pixels PX may be provided in the display region DS-DA. The sealing element SM may be provided to be overlapped with the non-display region DS-NDA. The sealing element SM may be substantially attached to the circuit device layer DS-CL. The sealing element SM may be attached to an insulating layer and/or a conductive pattern of the circuit device layer DS-CL.

As shown in FIG. 2B, the display substrate DS may include a driving circuit GDC, a plurality of signal lines SGL, a plurality of signal pads DS-PD, and a plurality of pixels PX. Each of the pixels PX may include an organic light emitting diode and a pixel driving circuit connected thereto. The driving circuit GDC, the signal lines SGL, the signal pads DS-PD, and the pixel driving circuit may be included in the circuit device layer DS-CL shown in FIG. 2A.

The driving circuit GDC may include a scan driving circuit. The scan driving circuit may be configured to generate a plurality of scan signals and to sequentially output the scan signals to a plurality of scan lines GL. The scan driving circuit may include a plurality of thin-film transistors, which are formed by the same method as that for the driving circuit of the pixels PX or by, for example, a low-temperature polycrystalline silicon (LTPS) or low-temperature polycrystalline oxide (LTPO) process.

The signal lines SGL may include scan lines GL, data lines DL, a power line PWL, and a control signal line CSL. Each of the scan lines GL may be connected to corresponding ones of the pixels PX, and each of the data lines DL may be connected to corresponding ones of the pixels PX. The power line PWL may be connected to the pixels PX. The control signal line CSL may be configured to provide control signals to the scan driving circuit. The signal pads DS-PD may be connected to the signal lines SGL, respectively.

The display substrate DS may include a chip mounting region NDA-TC, which is placed on a non-display region DS-NDA. The driving device DI (e.g., see FIG. 1A) may be mounted on the chip mounting region NDA-TC.

First chip pads TC-PD1 and second chip pads TC-PD2 may be provided on the chip mounting region NDA-TC. The first chip pads TC-PD1 may be connected to the data lines DL, and the second chip pads TC-PD2 may be connected to the signal pads DS-PD through the signal lines. Terminals of the driving device DI may be connected to the first chip pads TC-PD1 and the second chip pads TC-PD2. Thus, the data lines DL may be electrically connected to the signal pads DS-PD via the driving device DI.

As shown in FIG. 2C, the circuit device layer DS-CL and the display device layer DS-OLED may be sequentially provided on the base substrate DS-G. In the present embodiment, the circuit device layer DS-CL may include a buffer layer BFL, a first inorganic layer 10, a second inorganic layer 20, and an organic layer 30. The inorganic and organic materials in the circuit device layer DS-CL are not limited to specific materials, and in certain embodiments, the buffer layer BFL may be selectively provided or may be omitted.

A first transistor T1 and a second transistor T2 may be provided on the buffer layer BFL. In certain embodiments, at least one of the first and second transistors T1 and T2 may be provided to have a bottom gate structure.

A pixel definition layer PDL and an organic light emitting diode OLED may be provided on the organic layer 30. The pixel definition layer PDL may be formed of or include an organic material. A first electrode AE may be provided on the organic layer 30. The first electrode AE may be connected to an output electrode of the second transistor T2 through a penetration hole penetrating the organic layer 30. An opening OP may be defined in the pixel definition layer PDL. The opening OP of the pixel definition layer PDL may be provided to expose at least a portion of the first electrode AE. In certain embodiments, the pixel definition layer PDL may be omitted. A hole control layer HCL, a light emitting layer EML, an electron control layer ECL, and a second electrode CE may be sequentially provided on the first electrode AE.

Figure 3A:
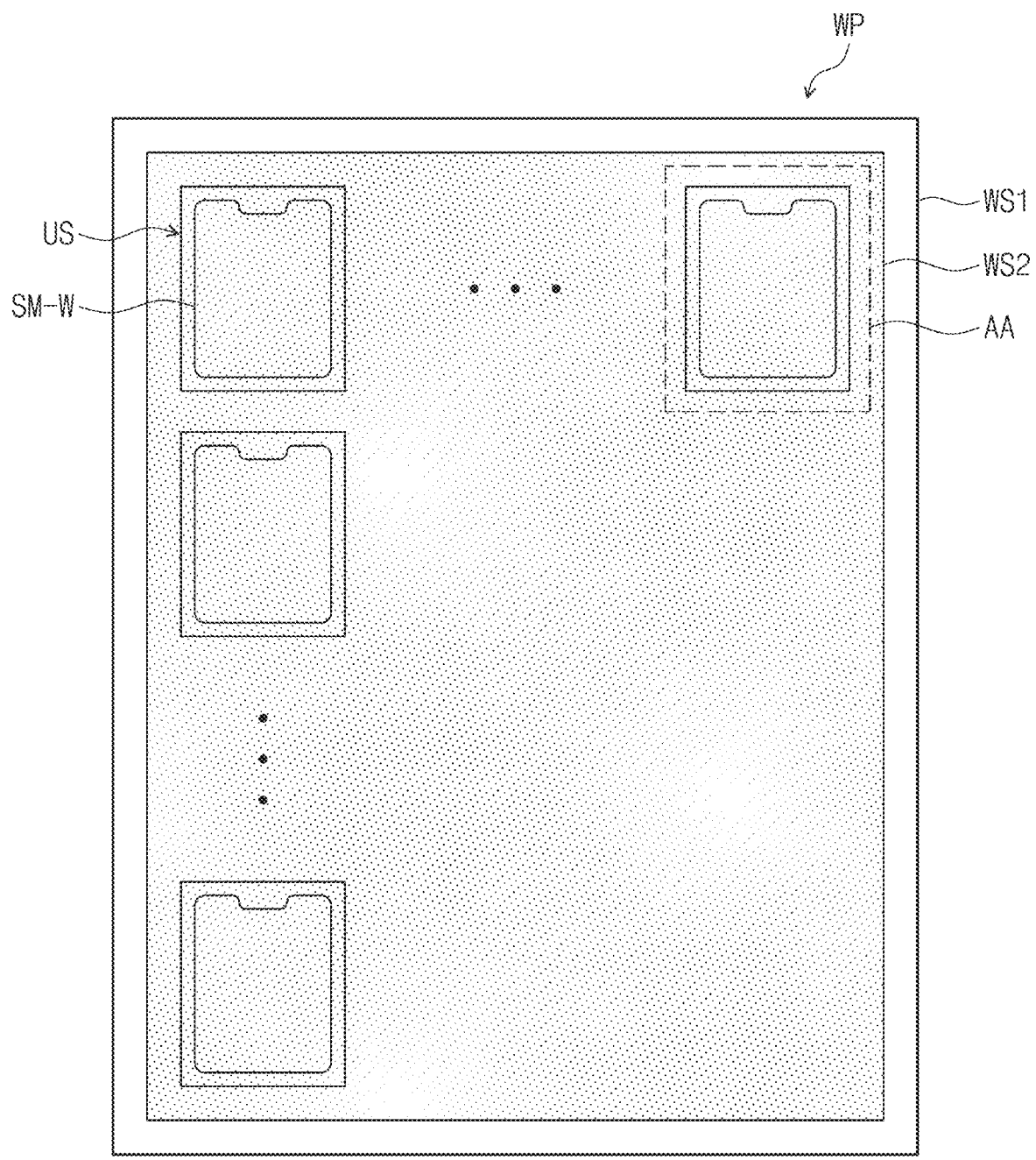
FIG. 3A is a plan view illustrating a working panel according to some embodiments of the inventive concept.
Figure 3B:
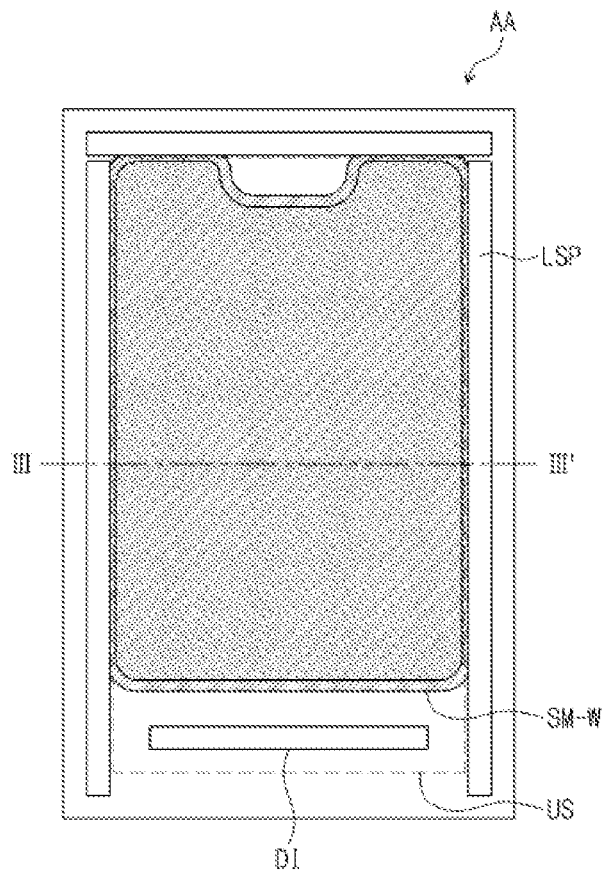
FIG. 3B is an enlarged plan view illustrating a cell region of a working panel according to some embodiments of the inventive concept.
Figure 3C:
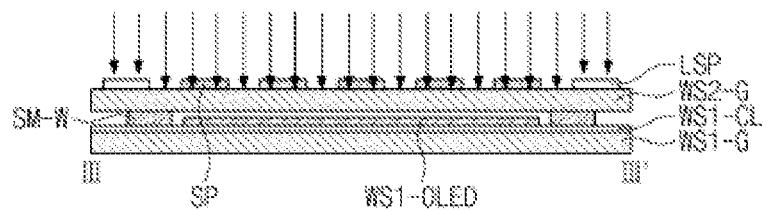
FIG. 3C is a sectional view illustrating a cell region of a working panel according to some embodiments of the inventive concept.
Figure 4:
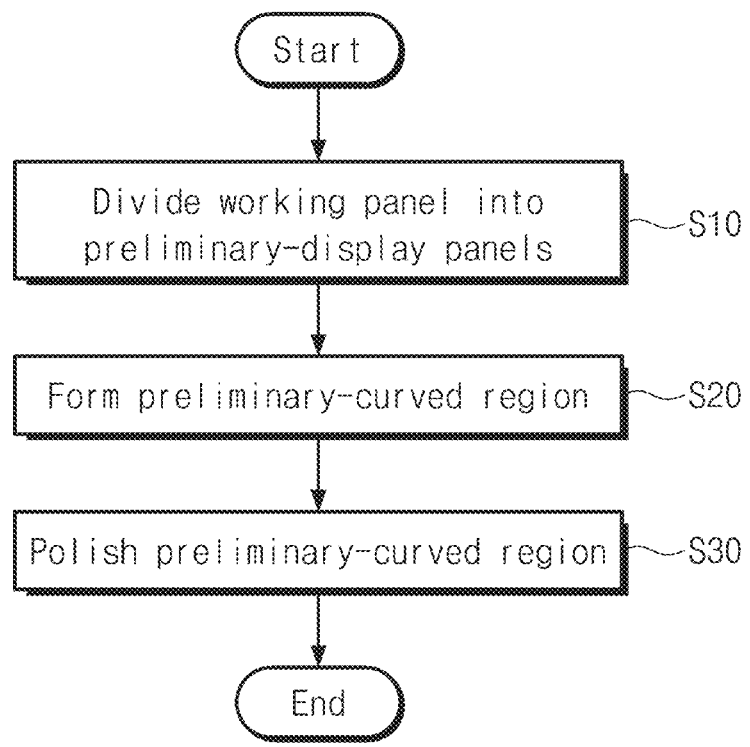
FIG. 4 is a flow chart illustrating a method of fabricating a display panel according to some embodiments of the inventive concept.

FIG. 3A is a plan view illustrating a working panel WP according to some embodiments of the inventive concept. FIG. 3B is an enlarged plan view illustrating a region AA of the working panel WP according to some embodiments of the inventive concept. FIG. 3C is an enlarged sectional view illustrating the cell region US of the working panel WP according to some embodiments of the inventive concept. FIG. 4 is a flow chart illustrating a method of fabricating the display panel DP, according to some embodiments of the inventive concept.

As shown in FIGS. 3A to 3C, the working panel WP may include a working display substrate WS1, a working encapsulation substrate WS2, which is provided to face the working display substrate WS1, and a working-sealing elements SM-W, which is provided to bond or couple the working display substrate WS1 to the working encapsulation substrate WS2. The working display substrate WS1 and the working encapsulation substrate WS2 may be fabricated by separate processes and then may be bonded to each other to form the working panel WP. The working-sealing element SM-W may be respectively formed on cell regions US of the working display substrate WS1 and the working encapsulation substrate WS2 and may be used as an adhesive member for bonding the working display substrate WS1 to the working encapsulation substrate WS2.

The working display substrate WS1 may be configured to have a layer structure described with reference to FIGS. 2A to 2C, on each of the cell regions US. As shown in FIG. 3C, a circuit device layer WS1-CL and a display device layer WS1-OLED may be provided on each of the cell regions US in the base substrate WS1-G.

As shown in FIG. 3C, the working encapsulation substrate WS2 may include a base substrate WS2-G and light-blocking patterns LSP, which are provided on a top or external surface of the base substrate WS2-G. The base substrate WS2-G may be a glass substrate. The light-blocking pattern LSP may be provided on each of the cell regions US.

As shown in FIGS. 3B and 3C, the light-blocking patterns LSP may be provided on three side surfaces of the cell region US, when viewed in a plan view. The light-blocking patterns LSP may be partially overlapped with the working-sealing element SM-W. The three light-blocking patterns LSP may be provided to face left, right, and upper side surfaces of the cell region US, when viewed in a plan view.

The light-blocking patterns LSP may be formed of or include a metallic material. Although not shown, metal patterns may be further provided on the top surface of the base substrate WS2-G and in a region enclosed by the light-blocking patterns LSP. The metal patterns may be directly provided on the top surface of the base substrate WS2-G or may be formed on an insulating layer, which is provided on the top surface of the base substrate WS2-G. The metal patterns may constitute signal lines of a touch sensing unit. Sensor electrodes SP constituting the touch sensing unit may be further provided on the top surface of the base substrate WS2-G. The sensor electrodes SP may be formed of or include at least one of transparent metal oxide materials (e.g., indium tin oxide (ITO), indium zinc oxide (IZO), zinc oxide (ZnO), or indium tin zinc oxide (ITZO)).

The working-sealing element SM-W may be optically cured. As shown in FIG. 3C, regions of the working-sealing element SM-W exposed by the light-blocking patterns LSP may be directly exposed by light (e.g., a laser beam). Since a laser beam is reflected by the light-blocking patterns LSP, a region of the working-sealing element SM-W overlapped with the light-blocking patterns LSP may be insufficiently or hardly cured. For example, the light-blocking patterns LSP may be used as a mask in a light curing process.

As shown in FIG. 4, the display panel DP according to the present embodiment may be fabricated from the working panel WP described with reference to FIGS. 3A to 3C. For example, the working panel WP may be divided into preliminary-display panels corresponding to the cell regions US (in S10), and when viewed in a plan view, each of the preliminary-display panels may be formed to have a tetragonal or rectangular shape. Thereafter, a preliminary-curved region may be formed in each of the preliminary-display panels (in S20). Next, polishing process may be performed on the preliminary-curved region (in S30). As a result of the polishing process, the display panel DP may be formed to have the curved region (e.g., the first regions E-C) of FIGS. 1A and 1B.

Figure 5A:
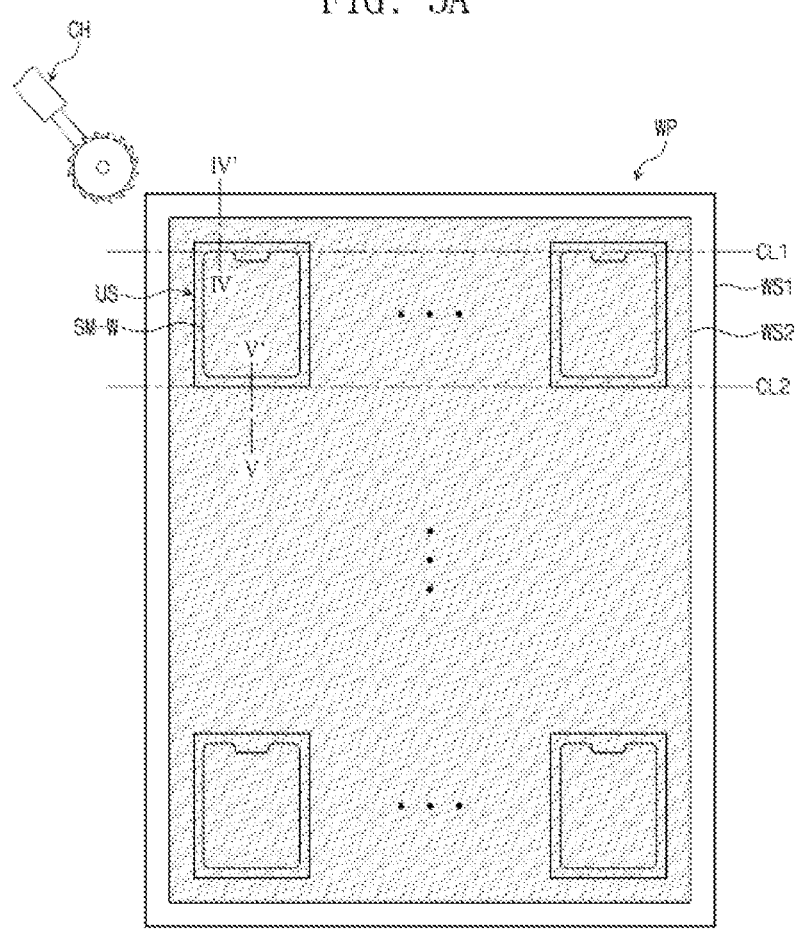
FIG. 5A is a plan view illustrating a first cutting step according to some embodiments of the inventive concept.
Figure 5B:
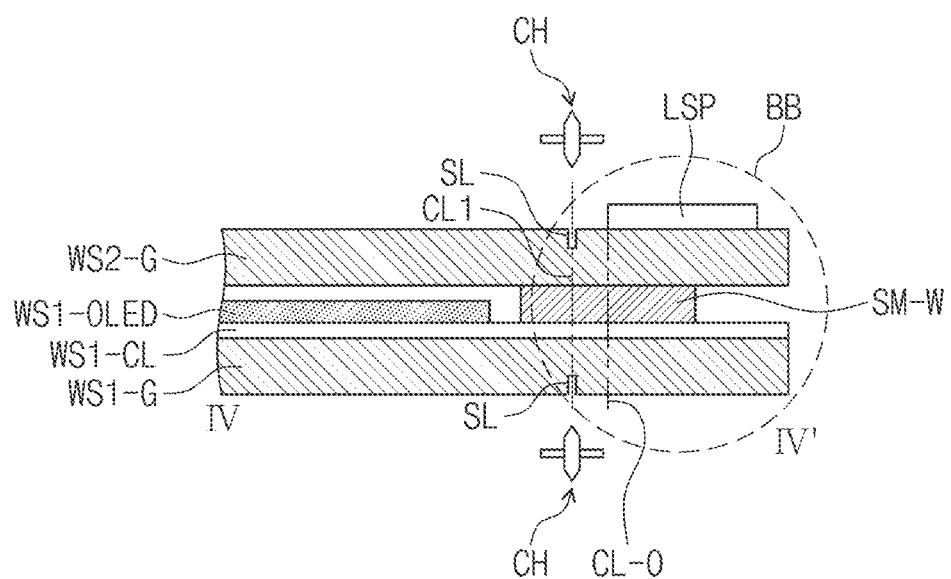
FIGS. 5B and 5C are enlarged sectional views, each illustrating a first cutting region of a working panel.
Figure 5C:
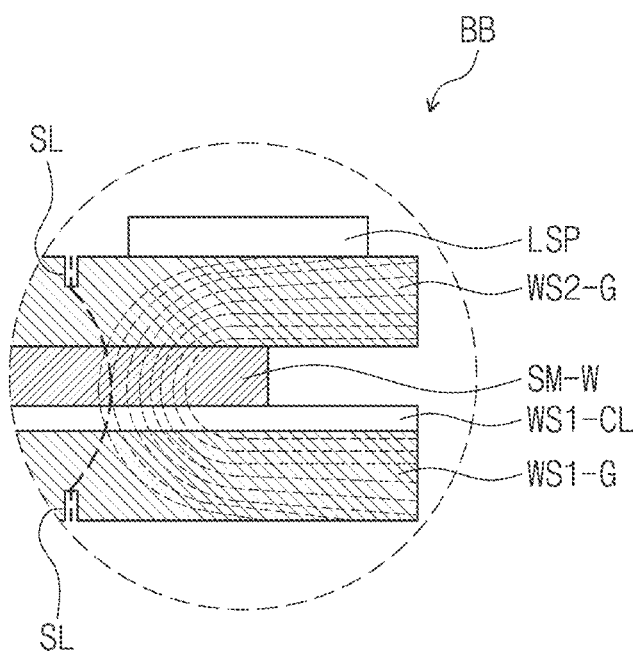
Figure 5D:
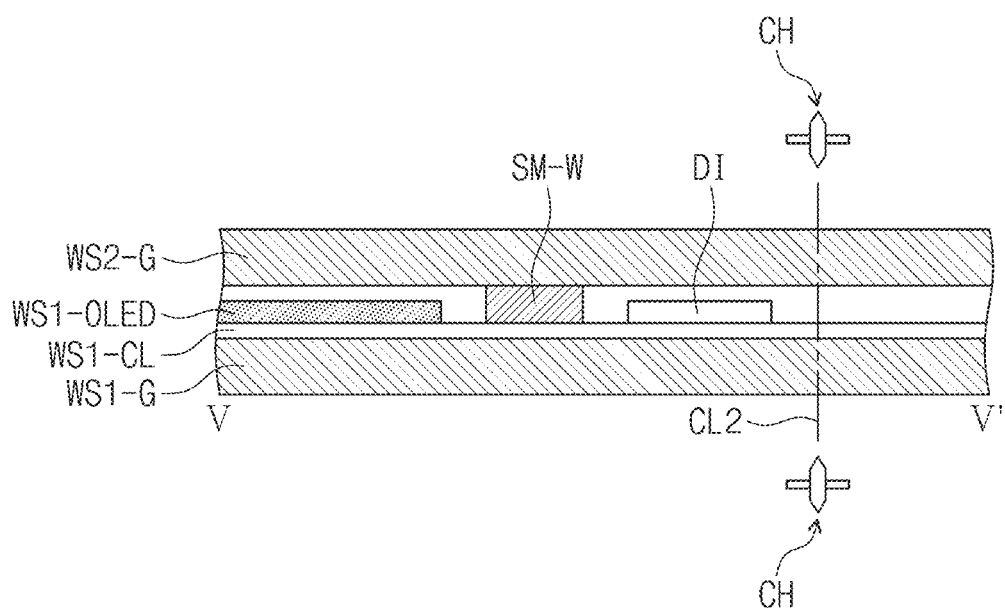
FIG. 5D is an enlarged sectional view illustrating a second cutting region of a working panel.
Figure 5E:
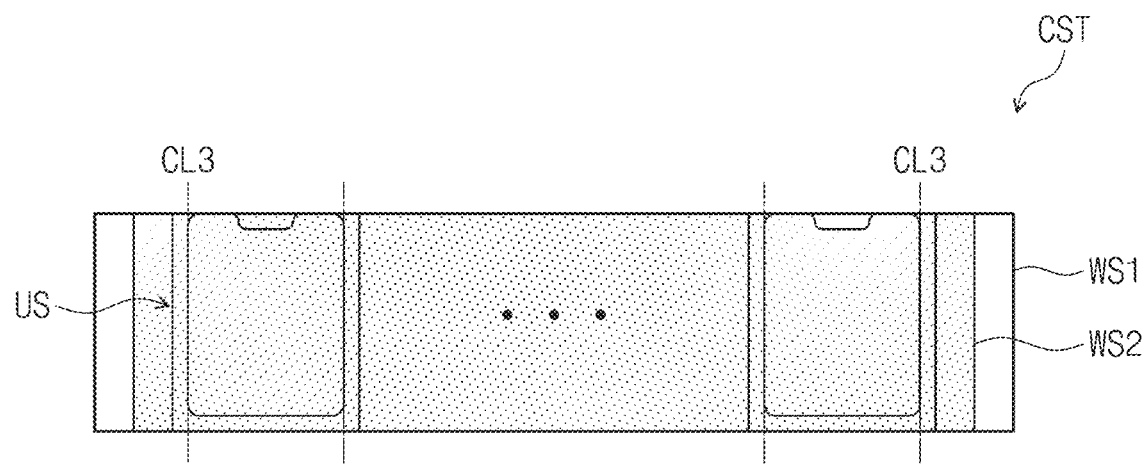
FIG. 5E is a plan view illustrating a second cutting step according to some embodiments of the inventive concept.

FIG. 5A is a plan view illustrating a first cutting step according to some embodiments of the inventive concept. FIGS. 5B and 5C are enlarged sectional views, each illustrating a first cutting region of the working panel WP. FIG. 5D is an enlarged sectional view illustrating a second cutting region of the working panel WP. FIG. 5E is a plan view illustrating a second cutting step according to some embodiments of the inventive concept. A step of cutting the preliminary-display panel shown in FIG. 4 will be described in more detail with reference to FIGS. 5A to 5E.

After the exposure process on the working panel WP described with reference to FIGS. 3A to 3C, the working panel WP may be divided into a plurality of cell sticks CST (e.g., see FIG. 5E). The working panel WP, in which the cell regions US are arranged in a matrix shape, may be cut in a row or column direction to form a plurality of the cell sticks CST, each of which includes a plurality of the cell regions US arranged in the row or column direction. As shown in FIG. 5E, each of the cell sticks CST may be formed to include a single row of the cell regions US, but the inventive concept is not limited thereto.

Hereinafter, a step of forming the cell stick CST will be described in more detail. As shown in FIGS. 5A to 5C, a cutting wheel CH may be used to form scribing lines SL in each of the base substrates WS1-G and WS2-G along a first cutting line CL1. The scribing lines SL may be formed by partially removing each of the base substrates WS1-G and WS2-G.

The first cutting line CL1 may be formed between the display device layer WS1-OLED and a reference line CL-0, and here, the reference line CL-0 may be defined along a border of the exposed region and the unexposed region of the working-sealing elements SM-W or along inner edges of the light-blocking patterns LSP. When measured in the third direction DR3, the scribing line SL may be formed to have a depth that is larger at a region (e.g., a concave region SM-CC, refer to FIG. 6A), which is not overlapped with the working-sealing element SM-W, than other region overlapped with the working-sealing element SM-W. The region of the scribing line SL, which is not overlapped with the working-sealing element SM-W, may be formed to wholly penetrate the base substrates WS1-G and WS2-G in the third direction DR3.

Since the working-sealing elements SM-W are partially exposed by the light, there may be a change in an internal stress of the base substrates WS1-G and WS2-G, as shown in FIG. 5C. In FIG. 5C, thin dotted lines depict the internal stress, and a thick dotted line depicts a cleaving line of the working panel WP. For example, if the scribing line SL is formed in the working panel WP, each of the cell sticks CST may be cut along the cleaving line depicted by the thick dotted line, due to the internal stress produced in the base substrates WS1-G and WS2-G.

As described with reference to FIG. 3C, if only the internal region of the working-sealing element SM-W is exposed to the light, a stress from the exposed region may be exerted on the base substrates WS1-G and WS2-G, after the curing of the working-sealing elements SM-W. By contrast, the unexposed region of the working-sealing elements SM-W may be merely in contact with the base substrates WS1-G and WS2-G but may not exert a stress on the base substrates WS1-G and WS2-G. This is because, during the curing process after the exposure process, a volume of the exposed region is shrunk to exert the stress on the base substrates WS1-G and WS2-G, but such phenomenon may not occur at the unexposed region. If an external force is exerted on the working panel WP, to which the scribing or cutting process has been performed, the working panel WP may be spontaneously cut along the cleaving line depicted by the thick dotted line.

As shown in FIG. 5D, the cutting wheel CH may be used to cut the working display substrate WS1 and the working encapsulation substrate WS2 along a second cutting line CL2. Accordingly, the cell stick CST may be formed, as shown in FIG. 5E.

The cutting wheel CH may be used to form the scribing lines SL in the base substrates WS1-G and WS2-G along third cutting lines CL3, and as a result, each of the cell sticks CST may be divided into a plurality of the preliminary-display panels. The cell stick CST may be cut into the preliminary-display panels corresponding to the cell regions US, respectively, by the same manner as that described with reference to FIGS. 5B and 5C.

Figure 6A:
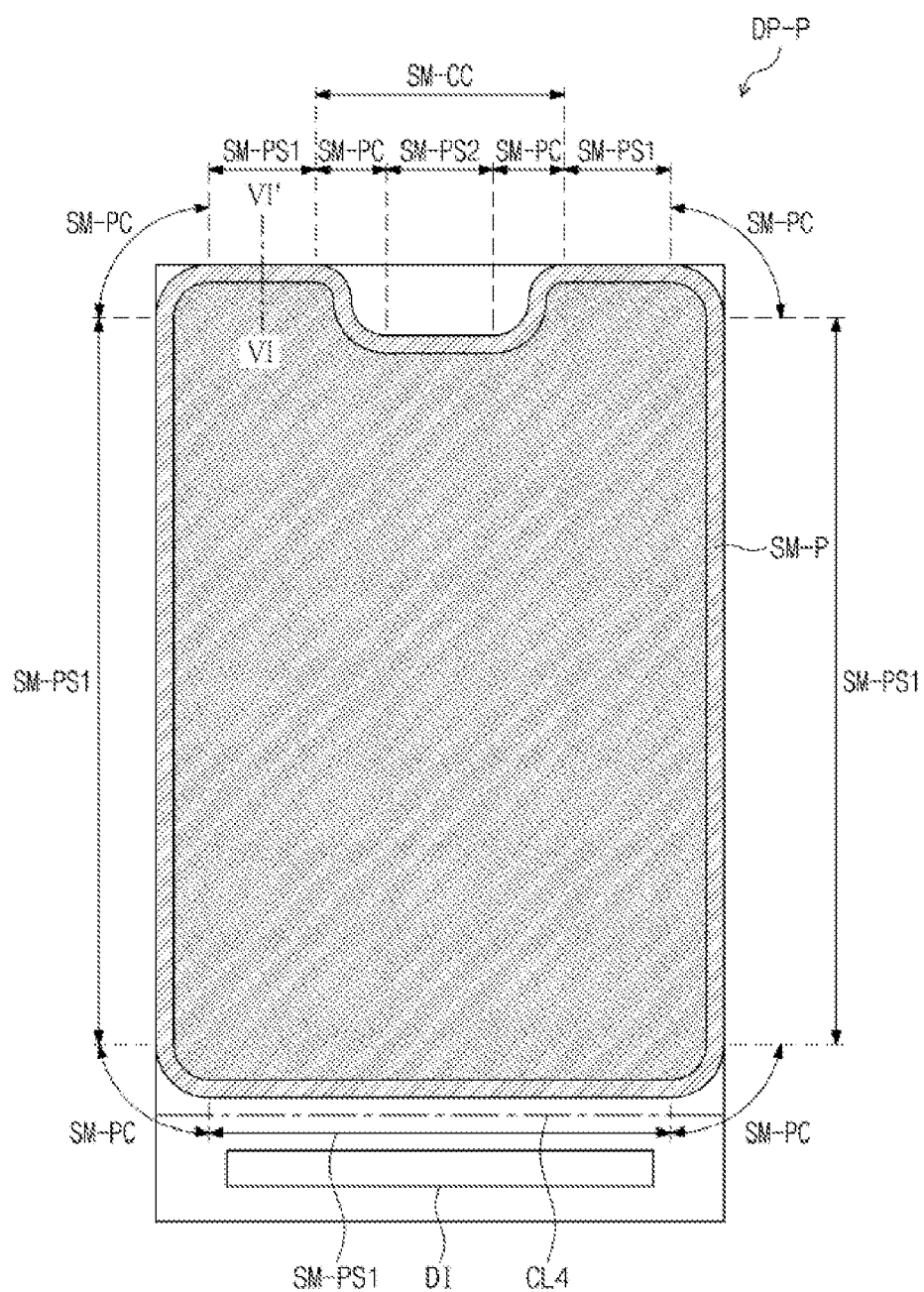
FIG. 6A is a plan view illustrating a preliminary-display panel according to some embodiments of the inventive concept.
Figure 6B:
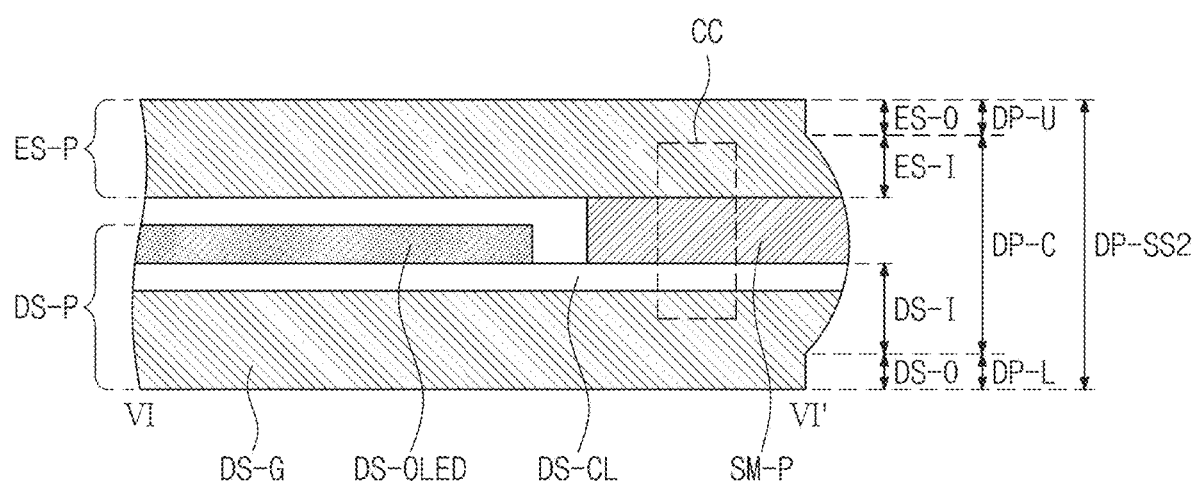
FIG. 6B is a sectional view illustrating a preliminary-display panel according to some embodiments of the inventive concept.
Figure 7A:
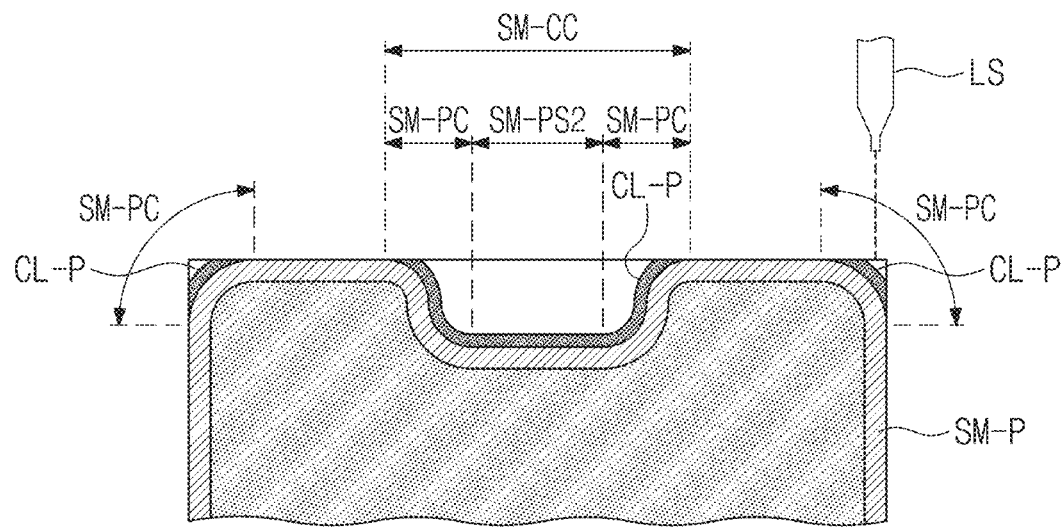
FIG. 7A is a plan view illustrating a step of forming a preliminary-curved region, according to some embodiments of the inventive concept.
Figure 7B:
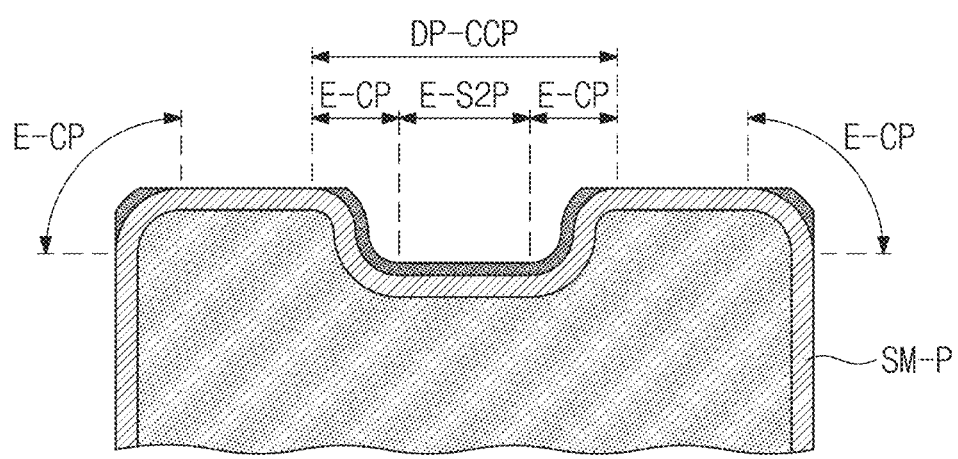
FIG. 7B is a plan view illustrating a preliminary-display panel with a preliminary-curved region according to some embodiments of the inventive concept.

FIG. 6A is a plan view illustrating a preliminary-display panel DP-P according to some embodiments of the inventive concept. FIG. 6B is a sectional view illustrating the the preliminary-display panel DP-P according to some embodiments of the inventive concept. FIG. 7A is a plan view illustrating a step of forming a preliminary-curved region, according to some embodiments of the inventive concept. FIG. 7B is a plan view illustrating a preliminary-display panel with a preliminary-curved region according to some embodiments of the inventive concept. The step of forming the preliminary-curved regions of FIG. 4 will be described in more detail with reference to FIGS. 6A to 7B.

As shown in FIGS. 6A and 6B, the preliminary-display panel DP-P may have a tetragonal or rectangular shape, when viewed in a plan view. The preliminary-display panel DP-P may include a preliminary-display substrate DS-P, a preliminary-encapsulation substrate ES-P, and a preliminary-sealing element SM-P, which is configured to bond or couple the preliminary-display substrate DS-P to the preliminary-encapsulation substrate ES-P.

The preliminary-display substrate DS-P may be provided to have substantially the same stacking structure but to have a different planar shape, compared with the display substrate DS shown in FIGS. 1A and 1B. The preliminary-encapsulation substrate ES-P may be provided to have a planar shape different from that of the encapsulation substrate ES shown in FIGS. 1A and 1B.

The preliminary-sealing element SM-P may include at least one rectilinear region and at least one curved region, when viewed in a plan view. The preliminary-sealing element SM-P may include a region, which is defined as the concave region SM-CC. The preliminary-sealing element SM-P may include curved regions SM-PC corresponding to the first regions E-C, respectively, of FIG. 1B. The preliminary-sealing element SM-P may include first rectilinear regions SM-PS1, which correspond to the second regions E-S1 of FIG. 1B, and a second rectilinear region SM-PS2, which corresponds to the third region E-S2 of FIG. 1B.

The preliminary-sealing element SM-P may be provided to have a curve shape, at corner regions adjacent to the pad region DP-PD (e.g., see FIG. 1A), unlike the edge of the display panel DP. However, the inventive concept is not limited thereto, and in certain embodiments, the corner regions of the preliminary-sealing element SM-P adjacent to the pad region DP-PD of FIG. 1A may have a linear shape (or rectilinear shape).

The preliminary-display panel DP-P may include a region that is formed to have substantially the same shape as that of a region of the display panel DP shown in FIGS. 1A to 1D. The second region E-S1 of the display panel DP and the first rectilinear region SM-PS1 of the preliminary-display panel DP-P corresponding thereto may have the same side or sectional structure as that shown in FIG. 6B. Since, as described with reference to FIGS. 5B and 5C, the base substrates WS1-G and WS2-G are cut using a difference in internal stress, the second regions E-S1 of the display panel DP and the first rectilinear region SM-PS1 of the preliminary-display panel DP-P may have curved side surfaces. A side surface DP-SS2 of the first rectilinear region SM-PS1 may include a center region DP-C, which is curved to form an outwardly convex shape (or outwardly convex line), when viewed in a sectional view.

The rectilinear region E-S1 of the edge of the display panel DP may be formed in a step of dividing the working panel WP into the preliminary-display panels DP-P corresponding to the cell regions US. In some embodiments, it may be unnecessary to perform the polishing process on the rectilinear region of the edge of the preliminary-display panel DP-P, and thus, it may be possible to reduce a process time for the polishing process to be described below. Furthermore, this may make it possible to reduce a total process time taken to fabricate the display panel.

When viewed in a sectional view, the side surface DP-SS2 of the second region E-S1 may further include an upper region DP-U, which is located above the center region DP-C, and a lower region DP-L, which is located below the center region DP-C. At least a portion of each of the upper and lower regions DP-U and DP-L may have a linear line (or rectilinear line or linear shape or flat profile), when viewed in a sectional view. As shown in FIG. 6B, each of the upper and lower regions DP-U and DP-L may have only a linear line, when viewed in a sectional view. For example, the side surfaces of the upper and lower regions DP-U and DP-L may be formed by the scribing lines SL shown in FIGS. 5B and 5C.

Referring to FIG. 6B, the center region DP-C may include a second internal region DS-I, which is a part of the display substrate DS, the preliminary-sealing element SM-P, and a second internal region ES-I, which is a part of the encapsulation substrate ES. The lower region DP-L may correspond to a second outer region DS-O of the display substrate DS, and the upper region DP-U may correspond to a second outer region ES-O of the encapsulation substrate ES.

After the cutting of the preliminary-display panel DP-P, the preliminary-encapsulation substrate ES-P may be partially cut along a fourth cutting line CL4 of FIG. 6A. The partial cutting may be performed using the cutting wheel CH. Thus, the encapsulation substrate ES may be formed to expose a portion of the preliminary-display substrate, on which the driving device DI will be provided, as shown in FIG. 1A. Furthermore, the encapsulation substrate ES may be formed to expose the signal pads DS-PD (e.g., see FIG. 2B). The process of cutting the preliminary-encapsulation substrate ES-P along the fourth cutting line CL4 may not be limited in terms of process order. For example, the process of cutting the preliminary-encapsulation substrate ES-P along the fourth cutting line CL4 may be performed after a subsequent process of forming or polishing the preliminary-curved regions.

As shown in FIG. 7A, a preliminary-curved region of the preliminary-display panel DP-P may be formed at a position corresponding to the curved region SM-PC of the preliminary-sealing element SM-P. A laser source LS may be used to partially cut the preliminary-display substrate DS-P and the preliminary-encapsulation substrate ES-P. The laser source LS may be a CO2 or UV laser source.

In some embodiments, the laser source LS may be used to form a plurality of holes (hereinafter, a hole line) in the preliminary-display substrate DS-P and the preliminary-encapsulation substrate ES-P along a curved cutting line CL-P. If an external force is exerted, the preliminary-display substrate DS-P and the preliminary-encapsulation substrate ES-P may be partially cut along the curved hole line. The preliminary-display substrate DS-P and the preliminary-encapsulation substrate ES-P, which are cut along the hole line, may be formed to have an uneven side surface.

The preliminary-display panel DP-P may be formed to include a preliminary-concave region DP-CCP (see FIG. 7B) corresponding to the concave region SM-CC of the preliminary-sealing element SM-P. In some embodiments, the cutting line CL-P may be set in such a way that it is continuously extended from the curved regions SM-PC of the preliminary-sealing element SM-P to cross the second rectilinear region SM-PS2 of the preliminary-sealing element SM-P, and then, the laser source LS may be used to cut the preliminary-display substrate DS-P and the preliminary-encapsulation substrate ES-P along the cutting line CL-P.

As shown in FIG. 7B, a preliminary-curved region E-CP of the preliminary-display panel DP-P may be formed to correspond to the curved region E-C (e.g., see FIG. 1B) of the display panel DP. In addition, the preliminary-concave region DP-CCP of the preliminary-display panel DP-P may be formed to correspond to the concave region DP-CC (e.g., see FIG. 1B) of the display panel DP. The preliminary-concave region DP-CCP may be defined by the preliminary-curved regions E-CP and a preliminary-rectilinear region E-S2P. In certain embodiments, according to a shape of the display panel, the preliminary-concave region DP-CCP of the preliminary-display panel DP-P may be omitted.

Figure 8A:
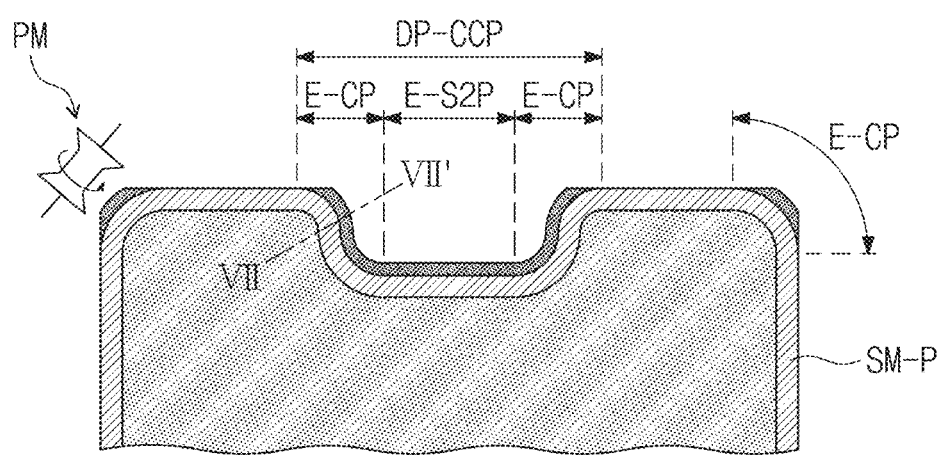
FIG. 8A is a plan view illustrating a step of polishing a preliminary-curved region, according to some embodiments of the inventive concept.
Figure 8B:
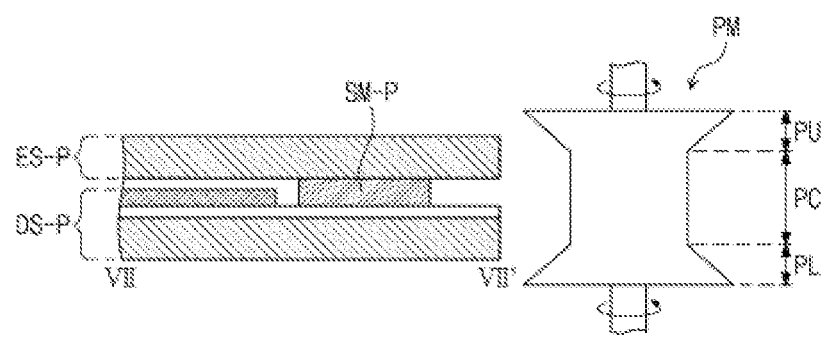
FIGS. 8B to 8D are sectional views illustrating a step of polishing a preliminary-curved region, according to some embodiments of the inventive concept.
Figure 8C:
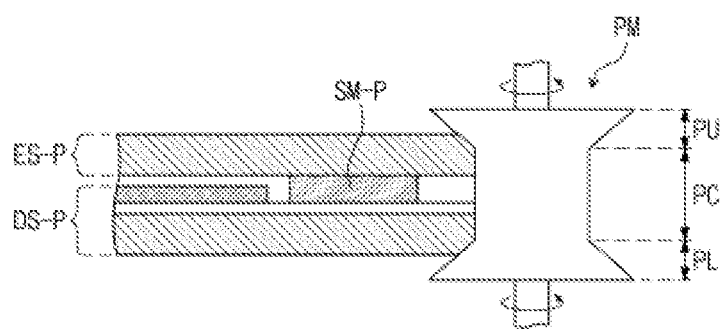
Figure 8D:
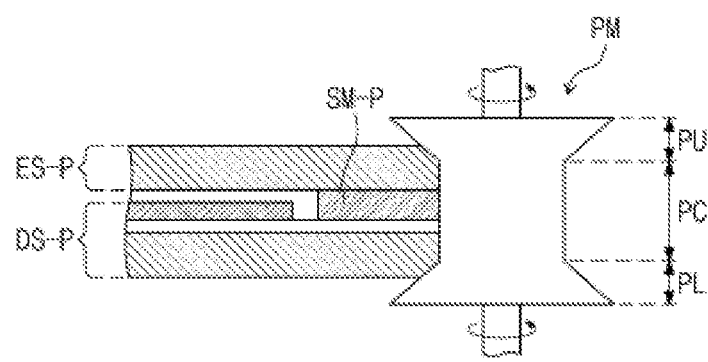
Figure 8E:
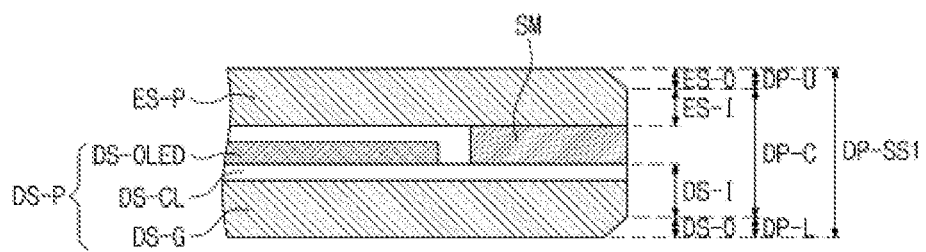
FIG. 8E is a sectional view illustrating a curved region of a display panel according to some embodiments of the inventive concept.

FIG. 8A is a plan view illustrating a step of polishing the preliminary-curved region E-CP, according to some embodiments of the inventive concept. FIGS. 8B to 8D are side views illustrating a step of polishing the preliminary-curved region E-CP, according to some embodiments of the inventive concept. FIG. 8E is a sectional view illustrating a curved region of the display panel DP according to some embodiments of the inventive concept. The step of polishing the preliminary-curved regions shown in FIG. 4 will be described in more detail with reference to FIGS. 8A to 8E.

The preliminary-curved region E-CP may be polished using a grinder PM. For example, the grinder PM may be rotated to polish side surfaces of the preliminary-display substrate DS-P and the preliminary-encapsulation substrate ES-P, as shown in FIGS. 8B to 8D. A polishing surface of the grinder PM may be covered with diamond.

The grinder PM may include a center portion PC, an upper portion PU, and a lower portion PL. The center portion PC may be shaped like a cylinder, and each of the upper and lower portions PU and PL may be shaped like a truncated cone. Each of the upper and lower portions PU and PL may have an increasing diameter with increasing distance from the center portion PC.

A shape of a side surface of the first region E-C of the display panel DP may vary depending on a polished amount. In the preliminary-curved region E-CP, side surfaces of the preliminary-display substrate DS-P and the preliminary-encapsulation substrate ES-P may be partially polished, as shown in FIG. 8C. The polishing may be performed to control surface roughness values of the side surfaces of the preliminary-display substrate DS-P and the preliminary-encapsulation substrate ES-P cut along the curved hole line. In this case, the side surface of the preliminary-sealing element SM-P may not be aligned to the side surfaces of the preliminary-display substrate DS-P and the preliminary-encapsulation substrate ES-P.

As shown in FIG. 8D, in the preliminary-curved region E-CP, the preliminary-display substrate DS-P and the preliminary-encapsulation substrate ES-P may be polished to allow the preliminary-display substrate DS-P and the preliminary-encapsulation substrate ES-P to have edges that are substantially aligned to the edge of the preliminary-sealing element SM-P. In this case, the side surface of the preliminary-sealing element SM-P may be aligned to the side surfaces of the preliminary-display substrate DS-P and the preliminary-encapsulation substrate ES-P. The preliminary-sealing element SM-P subjected to this process may be referred to as the sealing element SM shown in FIG. 8E.

To form the concave region DP-CC (e.g., see FIG. 1B) from the preliminary-concave region DP-CCP, both of the preliminary-curved region E-CP and the preliminary-rectilinear region E-S2P may be polished through the same process. Thus, the preliminary-curved region E-CP and the preliminary-rectilinear region E-S2P may have sectional shapes corresponding to each other.

As a result of the polishing process described with reference to FIGS. 8B to 8D, the side surface of the display panel DP may have substantially the same shape as the side surface DP-SS1 shown in FIG. 8E. The side surface DP-SS1 of each of the first region E-C and the third region E-S2 may include the center region DP-C having a rectilinear shape (or rectilinear line), when viewed in a sectional view.

The side surface DP-SS1 of the first region E-C may further include the upper region DP-U, which is positioned on the center region DP-C, and the lower region DP-L, which is positioned below the center region DP-C, when viewed in a sectional view. The upper region DP-U and the lower region DP-L may be inclined at an angle to a top surface of the encapsulation substrate ES, when viewed in a sectional view. That is, the upper region DP-U and the lower region DP-L may include an inclined shape (or inclined line), when viewed in a sectional view.

The center region DP-C may include the first internal region DS-I of the display substrate DS, the sealing element SM, and the first internal region ES-I of the encapsulation substrate ES. The lower region DP-L of the display panel DP may correspond to the first outer region DS-O of the display substrate DS, and the upper region DP-U of the display panel DP may correspond to the first outer region ES-O of the encapsulation substrate ES.

In a method of fabricating the display panel DP according to the present embodiment, during the formation of the preliminary-curved region E-CP, regions of the preliminary-display substrate DS-P and the preliminary-encapsulation substrate ES-P corresponding to the corner and concave regions may be removed in advance, and this may make it possible to reduce or minimize a polishing amount in the polishing process. In this case, it may be possible to reduce the use of a highly expensive grinder and thereby to reduce a production cost required to fabricate the display panel DP.

Figure 9A:
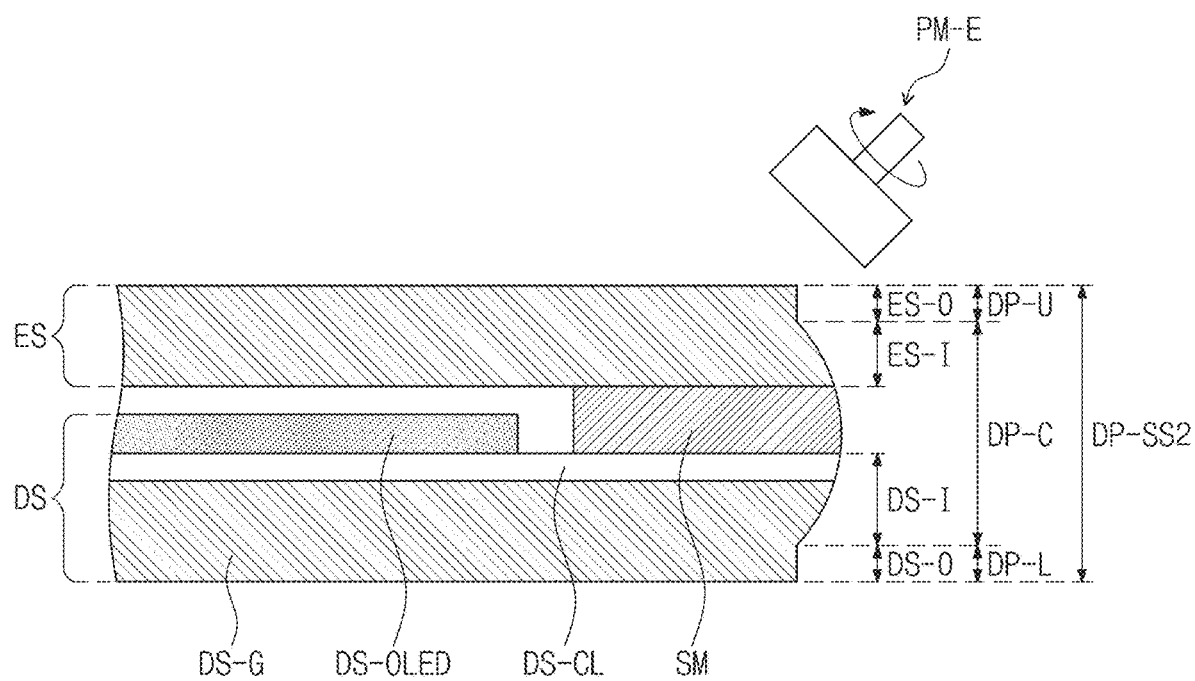
FIG. 9A is a side view illustrating an edge grinding step according to some embodiments of the inventive concept.
Figure 9B:
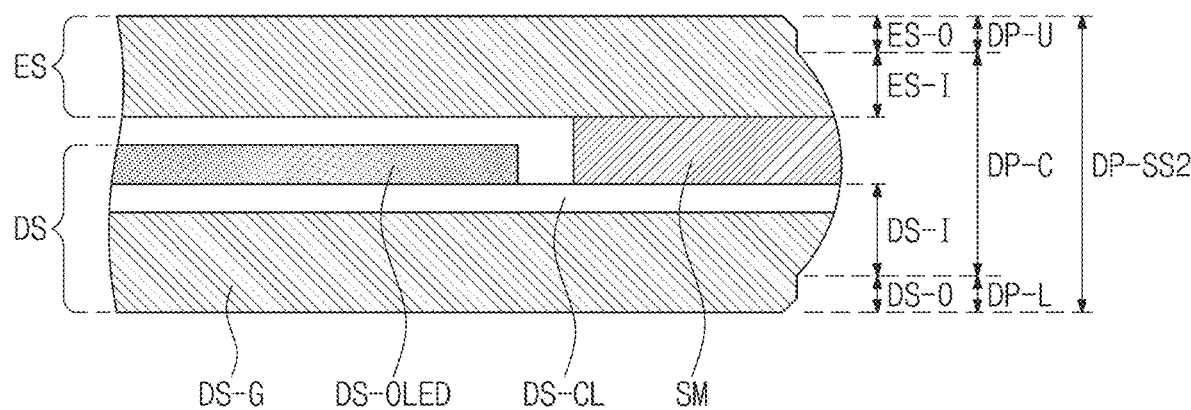
FIG. 9B is a sectional view illustrating a display panel with a grinded edge.

FIG. 9A is a side view illustrating an edge grinding step according to some embodiments of the inventive concept. FIG. 9B is a sectional view illustrating the display panel DP with a grinded edge.

In the cutting of the preliminary-display panel DP-P described with reference to FIGS. 5A to 5E, the second region E-S1 of the display panel DP may not be polished, and the base substrates may have sharp corners. Accordingly, an edge grinder PM-E may be used to polish a corner of the second region E-S1 of the display panel DP. This process may be performed using a chamfering method.

The side surface DP-SS2 of the second region E-S1 may include the upper region DP-U, which is located on the center region DP-C, and the lower region DP-L, which is located below the center region DP-C, when viewed in a sectional view. At least a portion of each of the upper and lower regions DP-U and DP-L may have a linear line (or rectilinear line or linear shape or flat profile), when viewed in a sectional view. As shown in FIG. 9B, each of the upper and lower regions DP-U and DP-L may further include a portion that is inclined at an angle to a top surface of the encapsulation substrate ES, when viewed in a sectional view. The inclined regions may be located outside the rectilinear region. For example, in each of the upper and lower regions DP-U and DP-L, the rectilinear region may be located between the inclined region and the curved region, when viewed in a sectional view. That is, each of the upper region DP-U and the lower region DP-L may include a linear line between a curved line and an inclined line, when viewed in a sectional view.

Figure 10A:
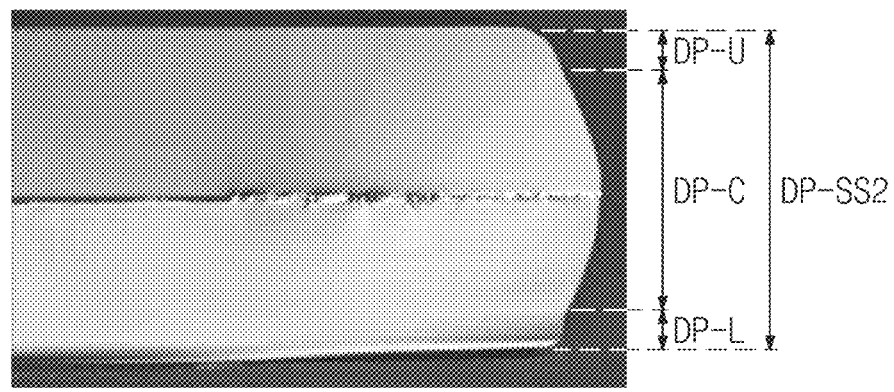
FIGS. 10A and 10B are sectional images showing a display panel, according to some embodiments of the inventive concept.
Figure 10B:
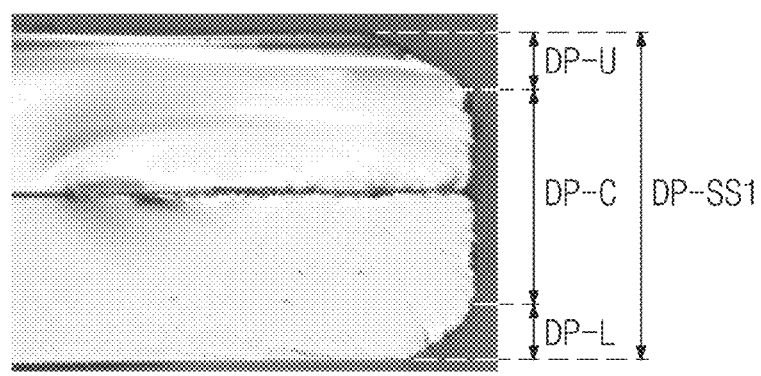
Figure 10C:
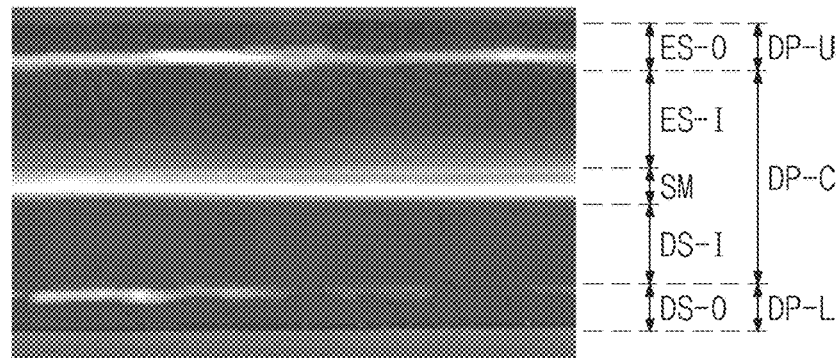
FIGS. 10C to 10E are images showing a side surface of a display panel according to some embodiments of the inventive concept.
Figure 10D:
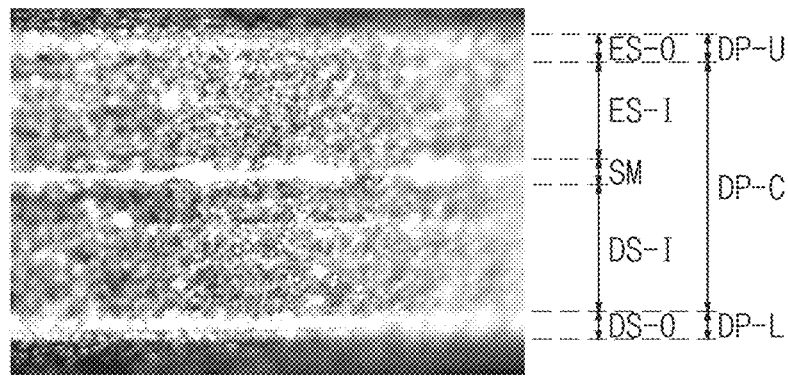
Figure 10E:
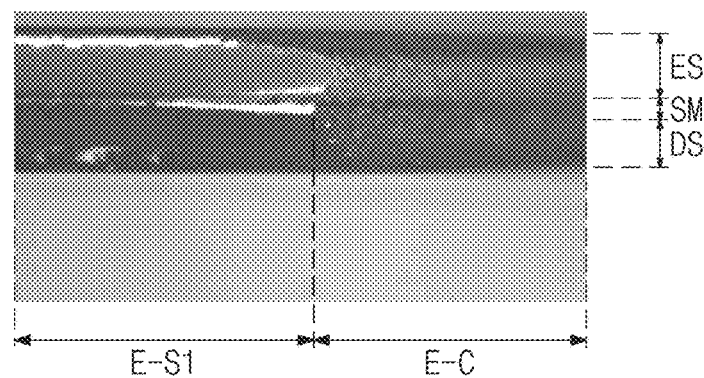

FIGS. 10A and 10B are sectional images showing the display panel DP, according to some embodiments of the inventive concept. FIGS. 10C to 10E are images showing a side surface of the display panel DP, according to some embodiments of the inventive concept.

FIG. 10A is an image corresponding to the structure of FIG. 9B, and FIG. 10B is an image corresponding to the structure of FIG. 8E. FIG. 10C is an image corresponding to the side surface of the second region E-S1 of FIG. 1B and showing a side surface of the structure illustrated in FIG. 10A. FIG. 10D is an image corresponding to the side surface of the first region E-C of FIG. 1B and showing a side surface of the structure illustrated in FIG. 10B. FIG. 10E is an image corresponding to a side surface of a right corner region of the structure of FIG. 1B and corresponding to a boundary region between the first region E-C and the second region E-S1.

The side surface of the first region E-C may have a first roughness, and the side surface of the second region E-S1 may have a second roughness, which is smoother than the first roughness. This difference may be because, as a result of the polishing process, the side surface of the first region E-C has a rough surface, but the second region E-S1 is cut by a crack phenomenon caused by the stress difference, by not the polishing process. For example, a side surface of the first region E-C may have a surface roughness Ra ranging from 1.6 µm to 6.3 µm, and the side surface of the second region E-S1 may have a surface roughness Ra ranging from 0.025 µm to 0.1 µm. Although not shown, the side surface of the third region E-S2 may have substantially the same roughness as that of the side surface of the first region E-C.

The roughness values were measured based on ISO 1302:1992. The conversion between the roughness values Ra and the roughness grade numbers may be given by the following table 1.

TABLE 1

| Roughness values (Ra) | | Roughness |
|---|---|---|
| µm | µin | Grade Numbers |
| 50 | 2000 | N12 |
| 25 | 1000 | N11 |
| 12.5 | 500 | N10 |
| 6.3 | 250 | N9 |
| 3.2 | 125 | N8 |
| 1.6 | 63 | N7 |
| 0.8 | 32 | N6 |
| 0.4 | 16 | N5 |
| 0.2 | 8 | N4 |
| 0.1 | 4 | N3 |
| 0.05 | 2 | N2 |
| 0.025 | 1 | N1 |

Figure 11A:
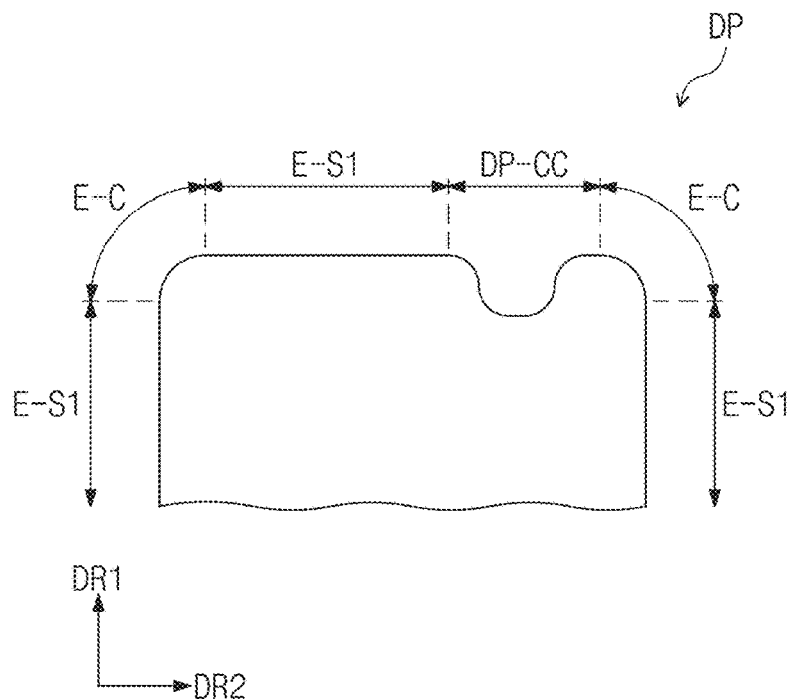
FIGS. 11A to 11C are plan views illustrating a display panel according to some embodiments of the inventive concept.
Figure 11B:
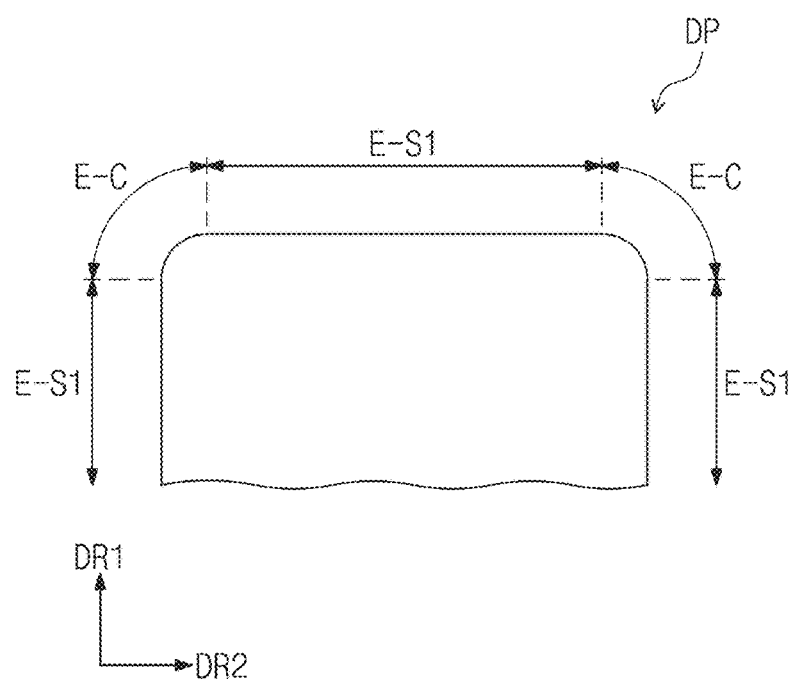
Figure 11C:
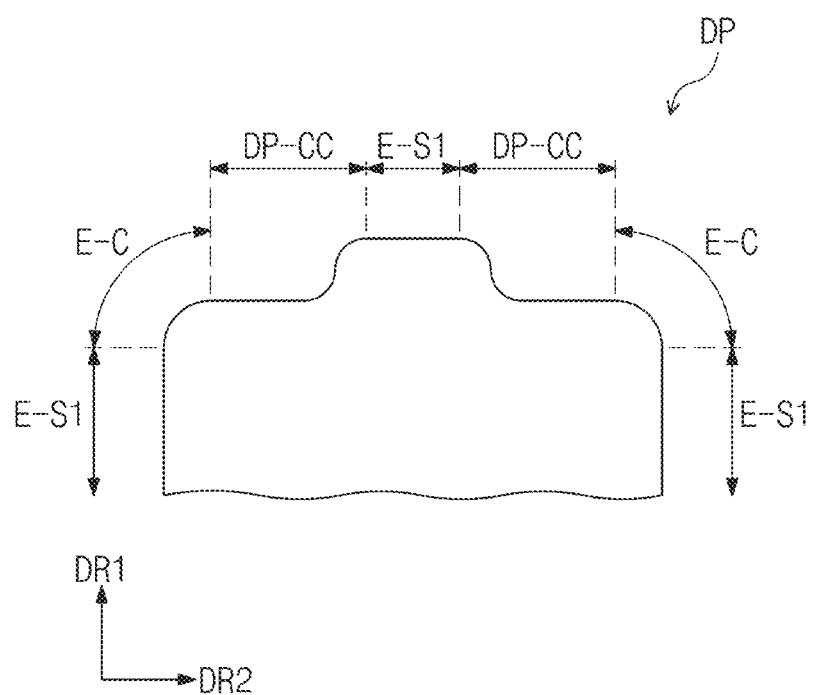
Figure 12:
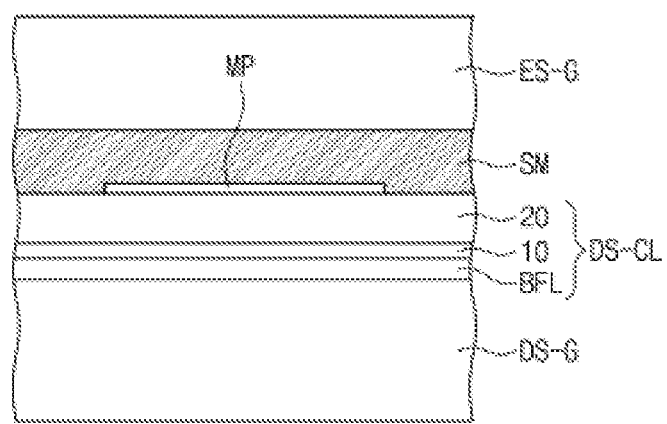
FIG. 12 is an enlarged sectional view of a portion of the display panel of FIG. 6B.

FIGS. 11A to 11C are plan views illustrating the display panel DP, according to some embodiments of the inventive concept. FIG. 12 is an enlarged sectional view of a portion of the display panel DP of FIG. 6B. For concise description, an element previously described with reference to FIGS. 1 to 10E may be identified by the same reference number without repeating an overlapping description thereof.

The display panel DP of FIGS. 11A to 11C may be provided to have a partially different planar shape, compared with the display panel DP of FIGS. 1A to 1D. For example, the display panel DP of FIG. 11A may be provided to have the concave region DP-CC, which is defined by only the curved region E-C. Furthermore, the concave region DP-CC may be provided in an off-centered manner (e.g., at a right portion of the display panel DP). Alternatively, as shown in FIG. 11B, the concave region DP-CC may be omitted from the display panel DP. Thus, in a process of fabricating the display panel DP shown in FIG. 11B, a step of forming the second concave region DP-CC may be omitted. In certain embodiments, as shown in FIG. 11C, the display panel DP may include a pair of concave regions DP-CC. The pair of the concave region DP-CC may be symmetrically provided at two opposite portions (e.g., left and right portions) of the display panel DP.

As shown in FIG. 12, the sealing element SM may be adhered to a circuit device layer DS-CL. The sealing element SM may be adhered to the second inorganic layer 20. Furthermore, the sealing element SM may be adhered to conductive patterns MP, which are formed by the same process as that for the electrodes of the transistors T1 and T2 (e.g., see FIG. 2C). In addition, the sealing element SM may be directly adhered to a bottom surface of a base substrate ES-G (e.g., a glass substrate) of the encapsulation substrate ES.

According to some embodiments of the inventive concept, most parts of a rectilinear region of an edge of a display panel may be formed in a step of dividing a working panel into preliminary-display panels corresponding to cell regions. Since an edge of the preliminary-display panel constitutes the edge of the display panel, it may be possible to reduce a process time required to polish the edge of the display panel. Thus, it may be possible to reduce the overall time taken to fabricate the display panel.

Furthermore, in the process of fabricating the display panel, it may be possible to reduce the use of a grinder containing a highly expensive material (e.g., diamond). This is because most parts of the rectilinear region of the edge of the preliminary-display panel constitutes the rectilinear region of the edge of the display panel and because, in order to reduce a polishing amount in a process of forming a preliminary-curved region, corner regions of a preliminary-display substrate and a preliminary-encapsulation substrate are removed in advance before the use of the grinder.

In the display panel fabricated by the fabrication method, an edge of a sealing element is aligned to edges of a display substrate and an encapsulation substrate in most regions, and thus, a bezel region can be formed to have a slim shape.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a display panel, comprising:
    separating a preliminary-display panel from a working panel, the preliminary-display panel comprising a preliminary-display substrate, a preliminary-encapsulation substrate facing the preliminary-display substrate, and a preliminary-sealing element coupling the preliminary-display substrate to the preliminary-encapsulation substrate and comprising a rectilinear region and a curved region, when viewed in a plan view;
    forming a preliminary-curved region in each of the preliminary-display substrate and the preliminary-encapsulation substrate, the preliminary-curved region, corresponding to the curved region of the preliminary-sealing element; and
    polishing the preliminary-curved region in each of the preliminary-display substrate and the preliminary-encapsulation substrate.

2. The method of claim 1, wherein the working panel comprises a working display substrate including cell regions, a working encapsulation substrate facing the working display substrate, and working-sealing elements coupling the working display substrate to the working encapsulation substrate, the working-sealing elements are disposed corresponding to the cell regions, and
    the working encapsulation substrate comprises a base substrate and light-blocking patterns, which are disposed on an outer surface of the base substrate and are partially overlapped with the working-sealing elements,
    wherein the separating of the preliminary-display panel comprises:
    optically curing the working-sealing elements using the light-blocking patterns as a mask; and
    cutting the working display substrate and the working encapsulation substrate along a cutting line, which is overlapped with an exposed region of each of the working-sealing elements, to form a plurality of pieces corresponding to the cell regions, respectively.

3. The method of claim 1, wherein the preliminary-sealing element further comprises a concave region, when viewed in a plan view, the method further comprises:
- forming a preliminary-concave region, which corresponds to the concave region of the preliminary-sealing element, in each of the preliminary-display substrate and the preliminary-encapsulation substrate; and
- polishing the preliminary-concave region.

4. The method of claim 1, wherein the polishing of the preliminary-curved region is performed to substantially aligning a side surface of the preliminary curved region of the preliminary-display substrate and a side surface of the preliminary curved region of the preliminary-encapsulation substrate to a side surface of the preliminary-sealing element when viewed in a sectional view.

5. The method of claim 1, further comprising partially cutting the preliminary-encapsulation substrate to expose a portion of the preliminary-display substrate, after the separating of the preliminary-display panel.

* * * * *